(12) United States Patent
Kang et al.

(10) Patent No.: US 9,690,128 B2
(45) Date of Patent: Jun. 27, 2017

(54) LIQUID CRYSTAL DISPLAY APPARATUS

(71) Applicant: LG Display Co., Ltd., Seoul (KR)

(72) Inventors: ChangGong Kang, Incheon (KR);
HyungGu Her, Gyeonggi-do (KR);
TaeMin Kim, Daegu (KR)

(73) Assignee: LG Display Co., Ltd., Seoul (KR)

( * ) Notice: Subject to any disclaimer, the term of this patent is extended or adjusted under 35 U.S.C. 154(b) by 11 days.

(21) Appl. No.: 14/806,900

(22) Filed: Jul. 23, 2015

(65) Prior Publication Data

US 2016/0026030 A1    Jan. 28, 2016

(30) Foreign Application Priority Data

Jul. 25, 2014  (KR) .................. 10-2014-0094959
Sep. 7, 2014   (KR) .................. 10-2014-0119549

(51) Int. Cl.
*G02F 1/1345* (2006.01)
*G02F 1/1333* (2006.01)

(52) U.S. Cl.
CPC .... *G02F 1/133308* (2013.01); *G02F 1/13452* (2013.01); *G02F 2001/133314* (2013.01); *G02F 2201/46* (2013.01)

(58) Field of Classification Search
CPC .................. G02F 1/133314; G02F 1/13452
See application file for complete search history.

(56) References Cited

U.S. PATENT DOCUMENTS

| | | | | |
|---|---|---|---|---|
| 4,985,989 A | * | 1/1991 | Murphy | H01R 13/633 29/264 |
| 6,628,351 B1 | * | 9/2003 | Kitamura | G02F 1/13452 349/56 |
| 2007/0126946 A1 | * | 6/2007 | Tae | G02F 1/133308 349/58 |
| 2008/0055834 A1 | * | 3/2008 | Matsuzaki | G02F 1/133308 361/679.01 |
| 2016/0131831 A1 | * | 5/2016 | Tomomasa | G02B 6/0031 348/790 |

* cited by examiner

*Primary Examiner* — Phu Vu
(74) *Attorney, Agent, or Firm* — Morgan, Lewis & Bockius LLP

(57) ABSTRACT

Provided is a liquid crystal display apparatus according to an exemplary embodiment of the present disclosure. The liquid crystal display apparatus includes: a liquid crystal display panel; a first chassis; a second chassis; a circuit unit; a flexible substrate; a shield unit; and a pem-nut. The shield unit is disposed to surround at least a part of the flexible substrate and circuit unit and be bonded to at least a part of the flexible substrate. The pem-nut is exposed through a hole penetrating the shield unit and the circuit unit, and a bolt-insertion part is disposed. A top side of the pem-nut is positioned to be higher than a top side of the circuit unit. In the liquid crystal display apparatus according to an exemplary embodiment of the present disclosure, the reliability of the liquid crystal display apparatus is improved.

18 Claims, 15 Drawing Sheets

LIQUID CRYSTAL DISPLAY APPARATUS

CROSS-REFERENCE TO RELATED APPLICATIONS

This application claims the priority of Korean Patent Application No. 10-2014-0094959 filed on Jul. 25, 2014, and Korean Patent Application No. 10-2014-0119549 filed on Sep. 7, 2014, in the Korean Intellectual Property Office, the disclosures of which are hereby incorporated herein by reference.

BACKGROUND

Field of the Invention

The present disclosure relates to a liquid crystal display apparatus, and more particularly, to a liquid crystal display apparatus which is capable of reducing assembly defects of the liquid crystal display apparatus by improving a bolting structure for assembling components, and realizing a thinner liquid crystal display apparatus. Also, by applying a pad unit composed of a foam pad layer and a rigid layer, a distance between the components can be secured and an impact of collision between the components can be relieved.

Description of the Related Art

A liquid crystal display apparatus is a display apparatus including a liquid crystal display panel. The liquid crystal display apparatus is driven by adjusting a transmittance of the liquid crystal display panel with respect to light from a light source such as a backlight unit. In recent years, a demand for a liquid crystal display apparatus with high resolution and low power consumption as well as a liquid crystal display apparatus with a reduced thickness and a minimized bezel has been increasing.

The liquid crystal display apparatus can be used as a part of an electronic device. If the liquid crystal display apparatus is used as a part of an electronic device, the liquid crystal display apparatus is configured to be connected with a housing of the electronic device and other components attached to the housing. For example, the liquid crystal display apparatus may be used as a part of a monitor or a television and may be connected with a housing of the monitor or television.

Meanwhile, the components of the liquid crystal display apparatus are accurately fixed at positions as designed, so that a minimum distance therebetween can be secured. If the components are not accurately fixed at positions as designed and thus a minimum distance therebetween cannot be secured, the components may be brought into undesired contact with each other or another component may be located at a position of one component, so that the liquid crystal display apparatus may be difficult to assemble.

A liquid crystal display apparatus of the related art includes a cover unit configured to partially surround an end of a liquid crystal display panel and a chassis for protecting the liquid crystal display panel. A flexible printed circuit board configured to connect a circuit unit for driving the liquid crystal display panel with the liquid crystal display panel is protected by the cover unit. The cover unit has large thickness in order to protect a part of the liquid crystal display panel and is fixed to a lateral side of the chassis. Further, the cover unit is disposed not to be in contact with the flexible printed circuit board.

Meanwhile, in order to realize a thin liquid crystal display apparatus, a structure not requiring a cover unit may be used. In this structure, a separate thin shield unit for protecting a flexible printed circuit board and a circuit unit may be used instead of the cover unit. The shield unit has small thickness and has a minimum distance from the other components in order to realize a thin liquid crystal display apparatus. In particular, the shield unit is configured to be in contact with the flexible printed circuit board. If the shield unit is in contact with the flexible printed circuit board and has a small distance from the other components and thus cannot be accurately fixed at a position as designed, when the components of the liquid crystal display apparatus are connected with each other, the components may be overlapped in position. Also, a shied unit-fixing structure such as a screw may be used in order to accurately fix the shield unit at a position as designed. However, a pressure applied to the liquid crystal display apparatus when the fixing structure is connected with the liquid crystal display apparatus may cause a change in a distance between the components of the liquid crystal display apparatus, and, thus, the components may be damaged.

In this regard, the liquid crystal display apparatus includes the chassis for accommodating the liquid crystal display panel. The chassis is configured to protect the liquid crystal display panel and also fix a position of the backlight unit or the like. In order to suppress a foreign material from being introduced between the chassis or between the chassis and another component into the liquid crystal display apparatus from the outside, a pad unit formed of a silicon material is provided between the chassis or between the chassis and another component.

Meanwhile, in order to make a liquid crystal display apparatus thin and minimize or remove a bezel, a distance between the chassis and the components disposed inside the chassis has been decreasing more and more. As a distance between the components is decreased, some of the components may be overlapped in position when the liquid crystal display apparatus is assembled. In addition, if a force is applied to the fixing structure in order to fix the shield unit, the components apply a pressure to each other, thereby causing damage to the components and various problems may occur.

In the related art, a pad unit is disposed between the liquid crystal display panel and a lateral chassis connected with the liquid crystal display panel in order to suppress a foreign material from being introduced, which causes various problems such as a short circuit. In the related art, the pad unit was formed of silicon having fixed thickness. Thus, if the pad unit is too thick, when the liquid crystal display panel and the lateral chassis are assembled, the pad unit applies a pressure to the liquid crystal display panel, and, thus, for example, alignment of a liquid crystal may be changed. If alignment of the liquid crystal is changed, a light-leakage phenomenon may occur in the liquid crystal display panel, resulting in a decrease in visibility.

However, the liquid crystal display apparatus of the related art uses an opaque cover unit. Therefore, even if a light-leakage phenomenon occurs in the liquid crystal display panel, an edge portion of the liquid crystal display panel is hidden by the cover unit and the light-leakage phenomenon is actually invisible to the naked eye.

As such, the cover unit may be used to hide light leakage occurring at the edge portion. However, in recent years, there is a tendency not to use the cover unit in order to further reduce thickness of the liquid crystal display apparatus. However, if a pad unit formed of silicon is used in a structure without using the cover unit, a pressure is applied to the liquid crystal display panel, and, thus, light leakage caused by a change in alignment of the liquid crystal may be directly exposed to a user. Further, if a pad unit having small thickness is used to minimize an overlap in position between the liquid crystal display panel and the pad unit, a foreign material from the outside may not be blocked.

Further, a light guide plate is disposed on a lower chassis for covering a lower side of the liquid crystal display apparatus, and a reflector is disposed under the light guide plate. At an edge portion of the reflector, an ink portion printed with black ink is formed in order to minimize reflection of light from the backlight unit in an undesired direction at the edge portion of the reflector. The ink portion reduces light leakage caused by the reflector.

Meanwhile, a pad unit is also disposed between the lower chassis and the lateral chassis. The pad unit seals a space between the lower chassis and the lateral chassis. Further, the pad unit separates the lower chassis from the reflector and the lower chassis from the light guide plate. However, when the lateral chassis and the lower chassis are connected with each other with the pad unit therebetween, if a sufficient distance between the lateral chassis and the lower chassis is not maintained, the pad unit bonded to a protruding portion of the lateral chassis may press an edge portion of the light guide plate. If pressure and heat are applied to the pressed edge portion of the light guide plate, the ink portion adheres to the light guide plate. When the reflector made of metal is expanded under a high-temperature and high-humidity condition, since the ink portion adheres to the light guide plate, the reflector cannot be evenly expanded but may be expanded with wrinkles. Such a phenomenon is referred to as a wrinkling phenomenon. The reflector in which the wrinkling phenomenon occurs cannot uniformly reflect an incident light throughout the liquid crystal display panel, and the non-uniformly reflected light may be seen as a mura.

SUMMARY

Accordingly, the present invention is directed to a liquid crystal display apparatus that substantially obviates one or more of the problems due to limitations and disadvantages of the related art.

An object of the present disclosure is to provide a liquid crystal display apparatus capable of minimizing a number of defects, which may be generated when components of the thin liquid crystal display apparatus, by stably fixing the components in the thin liquid crystal display apparatus.

Another object of the present disclosure is to provide a thin liquid crystal display apparatus improved in durability by minimizing a distance between components.

Another object of the present disclosure is to provide a liquid crystal display apparatus having a new structure which is capable of realizing a thinner liquid crystal display apparatus and also, at the same time, minimizing particles from being introduced from the outside.

Another object of the present disclosure is to provide a liquid crystal display apparatus such that even when a force is applied to a fixing structure for fixing a shield unit, components are not overlapped, and a distance between the components is maintained.

Another object of the present disclosure is to provide a liquid crystal display apparatus including a pad unit configured to maintain a narrow distance between components such as a liquid crystal display panel, a reflector, a light guide plate, and a chassis not to overlap the components in position and also protect the components by absorbing an impact when the components are overlapped with each other or a force is applied to the components.

Another object of the present disclosure is to provide a liquid crystal display apparatus in which a cover unit is not applied and a light-leakage phenomenon and an introduction of a foreign material from the outside are minimized.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a liquid crystal display apparatus comprises a liquid crystal display panel; a chassis unit; a circuit unit; a shield unit; and a fixing structure. The chassis unit is configured to surround the liquid crystal display panel, and the circuit unit is disposed to be in contact with the chassis unit. The shield unit is configured to surround at least a part of the chassis unit and circuit unit, and the fixing structure is configured to fix the shield unit and the circuit unit to the chassis unit. The fixing structure has an edge joint structure that suppresses a movement of the shield unit caused by an external impact. In the liquid crystal display apparatus according to an exemplary embodiment, since the shield unit can be fixed at a desired position, a distance between the shield unit and another component can be secured. Thus, it is possible to reduce an assembly defect rate of a thin liquid crystal display apparatus.

In some embodiments, the fixing structure may include a pem-nut provided at the chassis unit and a bolt fastened to the pem-nut through a hole of the shield unit and a hole of the circuit unit. Further, the fixing structure may have an edge joint structure in which a lateral side of the pem-nut is in contact with the hole of the shield unit.

In some embodiments, the fixing structure may further include an annular ring disposed between the bolt and the pem-nut, and the annular ring may be in contact with a topside of the shield unit and a top side of the pem-nut.

In another aspect, a liquid crystal display apparatus comprises a liquid crystal display panel; a first chassis; a second chassis; a circuit unit; a flexible substrate; a shield unit; and a pem-nut. The first chassis is disposed outside the liquid crystal display panel. The second chassis is disposed on the liquid crystal display panel to be parallel with the liquid crystal display panel and is connected with the first chassis. The circuit unit is disposed on the second chassis. One side of the flexible substrate is connected with the liquid crystal display panel, and the flexible substrate is bent to surround the first chassis, so that the opposite side is connected with the circuit unit. The shield unit is disposed to surround at least a part of the flexible substrate and circuit unit and is bonded to at least a part of the flexible substrate. A top side of the pem-nut is exposed through a hole penetrating the shield unit and the circuit unit, and the pem-nut includes a bolt-insertion part. The top side of the pem-nut is positioned to be higher than a top side of the circuit unit. In the liquid crystal display apparatus according to an exemplary embodiment, the pem-nut positioned to be higher than the top side of the circuit unit minimizes a space where the shield unit can be moved, so that the shield unit can be fixed at a position as designed. Therefore, the reliability of the liquid crystal display apparatus is improved.

In some embodiments, the top side of the pem-nut is positioned to be on the same plane as a top side of the shield unit or higher than the top side of the shield unit.

In some embodiments, the bolt-insertion part of the pem-nut is fastened to a bolt for fixing the shield unit.

In some embodiments, an upper part of the pem-nut fills a space between the shield unit and the bolt.

In some embodiments, the shield unit includes a portion in which an end portion of the hole is bent toward the second chassis, and the bent portion is in direct contact with the pem-nut.

In some embodiments, the second chassis includes a fixture pin which is provided within the second chassis and configured to be inserted into a hole of the flexible substrate, the circuit unit, or the shield unit corresponding to the fixture pin to fix the shield unit.

In some embodiments, the first chassis includes a first surface facing the second chassis and a second surface facing the liquid crystal display panel, and the liquid crystal display apparatus includes: a first pad unit interposed between the second chassis and the first surface of the first chassis; and a second pad unit interposed between the second surface of the first chassis and the liquid crystal display panel, and at least one of the first pad unit and the second pad unit is formed of a foam pad layer and a rigid layer.

In some embodiments, the second pad unit is bonded to the second surface of the first chassis, and the second pad unit is in contact with the liquid crystal display panel to minimize a foreign material from the outside.

In some embodiments, the liquid crystal display apparatus further includes: a light guide plate disposed inside the second chassis; a reflector disposed on one side of the light guide plate; and an ink portion disposed between an edge portion of the reflector and the light guide plate, and the reflector and the second chassis are separated from each other by a distance equal to or smaller than thickness of the rigid layer.

In some embodiments, the first chassis includes a protruding portion protruded toward a direction in which the liquid crystal display panel is disposed, and the second surface is a surface of the protruding portion facing the liquid crystal display panel.

In some embodiments, the liquid crystal display apparatus further includes: a third pad unit disposed on a third surface of the protruding portion facing a top side of the light guide plate, and a distance between the third pad unit and the light guide plate is smaller than thickness of the first pad unit.

In some embodiments, a sum of a distance between the reflector and the second chassis and a distance between the third pad unit and the light guide plate is smaller than the thickness of the first pad unit.

In another aspect, there is provided an electronic device. The electronic device includes: a body realized to accommodate a display panel; a flexible circuit board realized such that one end is connected with the display panel and the opposite end is connected with a circuit unit; a cover realized to cover the display panel and also press a rear side of the display panel to face a rear side of the circuit unit by folding the flexible circuit board along an edge of the display panel; and a fastening means realized to fix the cover to the body and suppress a positional deviation of the cover caused by an elastic restoring force of the flexible circuit board.

In some embodiments, the fastening means includes a male screw and a female screw, and the female screw is provided at a fastening hole of the circuit unit and the male screw is realized to be introduced from the outside to pass through the fastening hole of the cover corresponding to the fastening hole of the circuit unit to be accommodated by the female screw. Further, an outer peripheral surface of an inlet of the female screw is brought into contact with an inner peripheral surface of the fastening hole of the cover without having deviation of space, thereby suppressing a positional deviation of the cover.

In some embodiments, the inner peripheral surface of the fastening hole of the cover may be realized to have a burring structure.

In some embodiments, the electronic device may further include: a pad structure formed of a foam pad layer and a rigid layer to improve interference between components fastened by the fastening means and positioned within the body and improve light leakage from a backlight.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Figure 1:
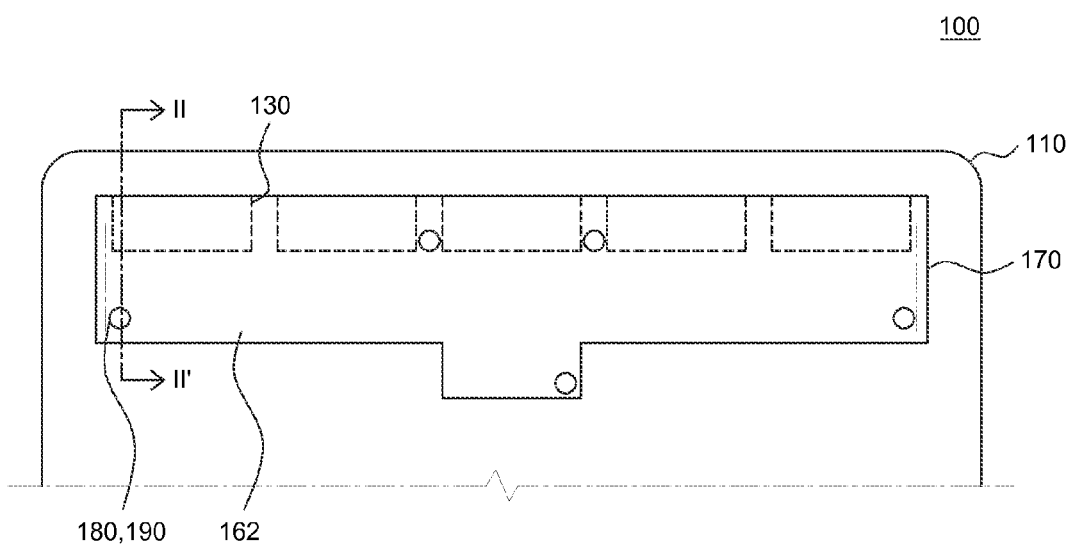
FIG. 1 is a schematic top view of a liquid crystal display apparatus according to an exemplary embodiment of the present disclosure.

Advantages and features of the present disclosure, and methods for accomplishing the same will be more clearly understood from exemplary embodiments described below with reference to the accompanying drawings. However, the present disclosure is not limited to the following exemplary embodiments but may be implemented in various different forms. The exemplary embodiments are provided only to complete disclosure of the present disclosure and to fully provide a person having ordinary skill in the art to which the present disclosure pertains with the category of the disclosure, and the present disclosure will be defined by the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the present specification. Further, in the following description, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly" is not used.

When an element or layer is referred to as being "on" another element or layer, it may be directly on the other element or layer, or intervening elements or layers may be present.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Throughout the whole specification, the same reference numerals denote the same elements.

Since size and thickness of each component illustrated in the drawings are represented for convenience in explanation, the present disclosure is not necessarily limited to the illustrated size and thickness of each component.

The features of various embodiments of the present disclosure can be partially or entirely bonded to or combined with each other and can be interlocked and operated in technically various ways as can be fully understood by a person having ordinary skill in the art, and the embodiments can be carried out independently of or in association with each other.

Hereinafter, various exemplary embodiments of the present disclosure will be described in detail with reference to the accompanying drawings.

Figure 2:
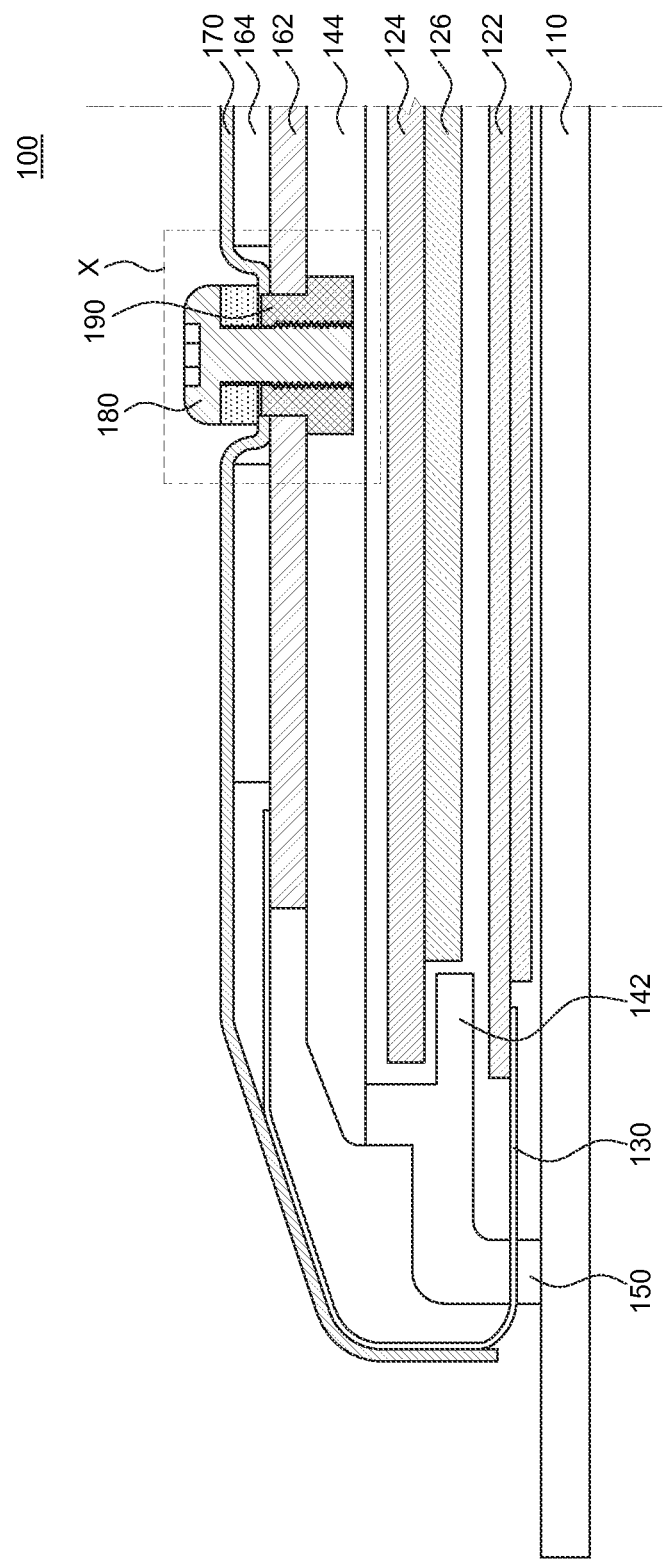
FIG. 2 is a cross-sectional view of the liquid crystal display apparatus taken along a line III-III' of FIG. 1.

FIG. 1 is a schematic top view of a liquid crystal display apparatus according to an exemplary embodiment of the present disclosure. FIG. 2 is a cross-sectional view of the liquid crystal display apparatus taken along a line of FIG. 1.

Referring to FIG. 1 and FIG. 2, a liquid crystal display apparatus 100 includes a transparent plate 110, a liquid crystal display panel 122, a flexible substrate 130, a light guide plate 124, an optical layer 126, a first chassis 142, a second chassis 144, a supporting member 150, a circuit unit 162, an electric part 164, and a shield unit 170. In FIG. 1, only the transparent plate 110, the flexible substrate 130, the circuit unit 162, the shield unit 170, a bolt 180, and a pem-nut 190 are illustrated for convenience in explanation, and a lower part of the shield unit 170 is illustrated by a dotted line.

Referring to FIG. 2, the liquid crystal display panel 122 is a display panel configured to adjust an amount of light transmitted from a backlight by alignment of a liquid crystal and realize a color by allowing the transmitted light to pass through a color filter. Although not illustrated in the drawings, the liquid crystal display panel 122 includes a plurality of transistors, a liquid crystal layer, and pad electrodes for transmitting various signals to the plurality of transistors and liquid crystal cells.

The optical layer 126 and the light guide plate 124 are disposed on the liquid crystal display panel 122. The light guide plate 124, for example, is a component configured to guide light of a backlight such as an LED (light emitting diode) disposed on a lateral side of the liquid crystal display apparatus 124 to be uniformly irradiated in a direction in which the liquid crystal display panel 122 is disposed. The optical layer 126 that transmits light from the light guide plate 124 is formed between the light guide plate 124 and the liquid crystal display panel 122. The optical layer 126 may be a single layer or may be a plurality of layers performing various optical functions. The optical layer 126 may perform, for example, a function of concentrating or dispersing light.

The transparent plate 110 bonded to the liquid crystal display panel 122 is disposed under the liquid crystal display panel 122. The transparent plate 110 may be formed of a material having flexibility such as polyimide or glass. The transparent plate 110 has a greater area than the liquid crystal display panel 122.

The supporting member 150 is attached to one side of the transparent plate 110 and configured to support the flexible substrate 130 and disposed outside the liquid crystal display panel 122.

The first chassis 142 is disposed above the supporting member 150 and outside the liquid crystal display panel 122. The first chassis 142 protects the liquid crystal display apparatus 100 by suppressing introduction of a foreign material from a lateral side of the liquid crystal display apparatus 100. The first chassis 142 may be formed of, for example, a plastic material in order to suppress a short with respect to the other components. The second chassis 144 is disposed on the first chassis 142. The second chassis 144 reduces introduction of a foreign material from the above of the liquid crystal display apparatus 100 and protects the liquid crystal display apparatus 100 against an impact or the like. The second chassis 144 is disposed on the liquid crystal display panel 122 to be parallel with the liquid crystal display panel 122.

The first chassis 142 and the second chassis 144 are not limited to the configuration as illustrated in FIG. 2, and may have a structure supporting various components depending on a design. The first chassis 142 and the second chassis 144 surround the liquid crystal display panel 122, and in order to do so, for example, a top side or a bottom side of the second chassis 144 may be protruded in part depending on a design. Further, if the second chassis 144 is formed of a metal, a part of the second chassis 144 may be insulated in order to suppress an electrical connection with the other components. The first chassis 142, the second chassis 144, and the transparent plate 110 may be a body realized to accommodate a display panel such as the liquid crystal display panel 122. The structure or configuration of the first chassis 142, the second chassis 144, and the transparent plate 110 described in the present specification is just an example and may have various shapes without limitation for the purpose of accommodating the display panel.

Referring to FIG. 1 and FIG. 2, the liquid crystal display apparatus 100 includes the flexible substrate 130 of which one end is connected with the liquid crystal display panel 122 and the opposite end is connected with the circuit unit 162. The flexible substrate 130 may be connected with a pad electrode of a substrate on which a thin-film transistor is disposed in the liquid crystal display panel 122. The flexible substrate 130 is extended from the liquid crystal display panel 122 to pass through a space between the first chassis 142 and the transparent plate 110 and bent to cover the outside of the first chassis 142 and the second chassis 144. Thus, the first chassis 142 supports a part of the flexible substrate 130, so that the flexible substrate 130 is more stably supported. The bent flexible substrate 130 is connected with the circuit unit 162. That is, one side of the flexible substrate 130 is connected with the liquid crystal display panel 122, and the flexible substrate 130 is bent to surround the first chassis 142 and the second chassis 144, so that the opposite side thereof is connected with the circuit unit 162. The flexible substrate 130 is configured to connect the circuit unit 162 with the liquid crystal display panel 122 and may be, for example, such as a flexible circuit board, a flexible printed circuit board, or a COF (Chip on Film).

The circuit unit 162 is a component on which various electric parts 164 for driving the liquid crystal display panel 122 are mounted and is disposed to be in contact with the second chassis 144. For example, the circuit unit 162 is disposed on the second chassis 144. The circuit unit 162 may be a printed circuit board on which a chip is mounted.

The shield unit 170 is a component configured to protect the flexible substrate 130 and the circuit unit 162 against an external impact, water, dust, and the like. The shield unit 170 surrounds at least a part of the first chassis 142, second chassis 144, and circuit unit 162. Referring to FIG. 1, the shield unit 170 is disposed at an upper part of the liquid crystal display apparatus 100 to cover the flexible substrate 130 and the circuit unit 162. Further, referring to FIG. 2, the shield unit 170 surrounds the flexible substrate 130 from a bent portion outside the first chassis 142 to a portion extended toward the circuit unit 162, and surrounds the circuit unit 162 and the electric part 164 disposed on the circuit unit 162. That is, the shield unit 170 is disposed to surround at least a part of the flexible substrate 130 and circuit unit 162 to be in contact with at least a part of the flexible substrate 130. The shield unit 170 also serves as a cover configured to cover the liquid crystal display panel 122, and the cover is folded along an edge of the liquid crystal display panel 122 to press a rear side of the liquid crystal display panel 122 and a rear side of the circuit unit 162 to face each other.

The shield unit 170, the circuit unit 162, and the flexible substrate 130 connected with the circuit unit 162 are fixed by the pem-nut 190 mounted on the second chassis 144 and the bolt 180. The pem-nut 190 and the bolt 180 constitute a shield unit-fixing structure, and the shield unit-fixing structure has an edge joint structure that suppresses movements of the shield unit 170 caused by an external impact. To be more specific, the shield unit-fixing structure includes the pem-nut 190 mounted on the second chassis 144 and the bolt 180 fastened to the pem-nut 190 through a hole of the shield unit 170 and a hole of the circuit unit 162. Also, the shield unit-fixing structure has an edge joint structure in which a lateral side of the pem-nut 190 is in contact with the hole of the shield unit 170. The shield unit-fixing structure serves as a fastening means and fixes the shield unit 170, namely a cover, to the second chassis 144 as a part of the body and suppresses a deviation of the shield unit 170 from an intended position by an elastic restoring force of the flexible substrate 130. FIG. 1 illustrates five positions where the pem-nuts 190 and bolts 180 for fixing the circuit unit 162 and the shield unit 170 are disposed. In the present specification, the pem-nut 190 and the bolt 180 are realized as fastening means, but such realization is just an example. For example, the pem-nut 190 may be one of various female screws provided at the fastening hole of the circuit unit 162. Further, the bolt 180 may be a male screw to be introduced from the outside to pass through the fastening hole of the cover or shield unit 170 corresponding to the fastening hole of the circuit unit 162 to be accommodated by the female screw. Due to the female screw and the male screw, an outer peripheral surface of an inlet of the female screw is brought into contact with an inner peripheral surface of the fastening hole of the cover without a space for deviation, and, thus, a positional deviation of the cover or shield unit 170 is suppressed.

Further, referring to FIG. 1 again, the pem-nuts 190 and bolts 180 of various numbers at various positions may be disposed without being limited to the positions and the numbers of the pem-nuts 190 and bolts 180 illustrated in FIG. 1. For example, the number and position of the pem-nut 190 and bolt 180 may be adjusted depending on a design of the circuit unit 162 and the electric part 164 or a size of the circuit unit 162 and the electric part 164. Further, the electric part 164 is not formed at a portion where the pem-nut 190 and the bolt 180 are disposed, and a hole where the shield unit-fixing structure including the pem-nut 190 and the bolt 180 is disposed is formed in the shield unit 170. The shield unit-fixing structure is in close contact with the shield unit 170 in order to suppress movements of the shield unit 170. Hereinafter, referring to FIG. 3 and FIG. 4, an exemplary embodiment of the shield unit-fixing structure in which the pem-nut 190 and the bolt 180 are fastened to each other will be described in more detail.

Figure 3:
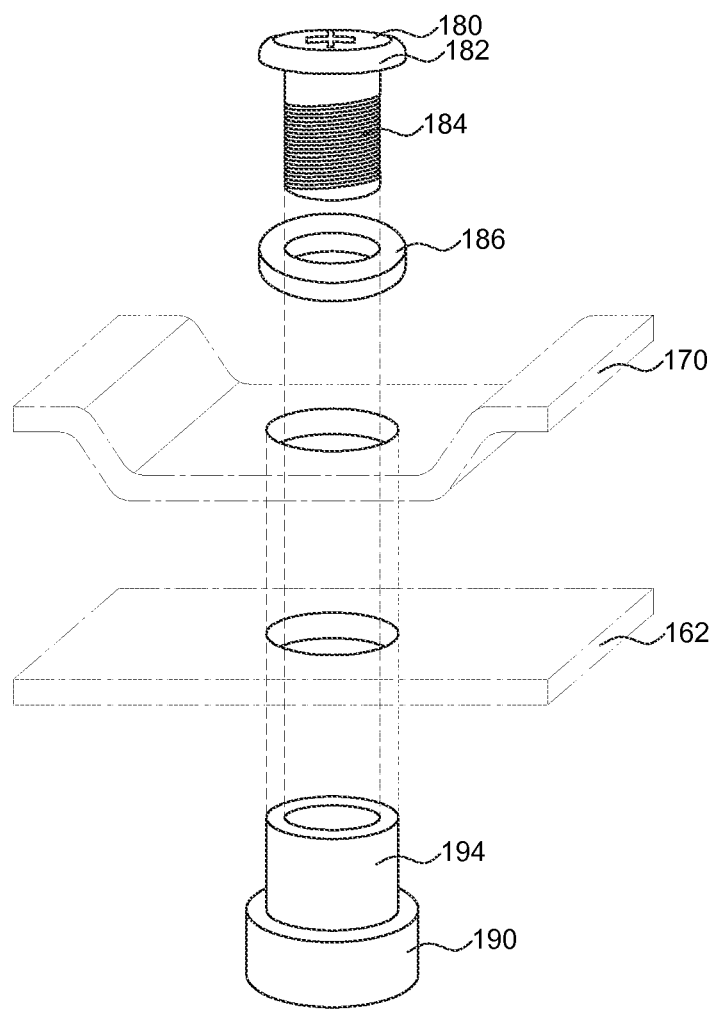
FIG. 3 is an exploded perspective view of an area X of FIG. 2.

FIG. 3 is an exploded perspective view of an area X of FIG. 2. FIG. 3 illustrates that the bolt 180, an annular ring 186, a part of the shield unit 170, a part of the circuit unit 162, and the pem-nut 190 are aligned. For convenience in explanation, the electric part 164 and the second chassis 144 illustrated in FIG. 2 are omitted. Referring to FIG. 3, the annular ring 186 is disposed under the bolt 180 to be overlapped with a head portion 182 of the bolt 180. The circumference of a body portion 184 of the bolt 180 substantially corresponds to the inner circumference of the annular ring 186. The body portion 184 of the bolt 180 may penetrate the holes of the circuit unit 162 and the shield unit 170 to be connected with the pem-nut 190. The shield unit 170 and the circuit unit 162 have the holes having substantially the same shape. The circumference of the holes of the shield unit 170 and the circuit unit 162 substantially corresponds to the outer circumference of a protruding portion 194 of the pem-nut 190. A connection shape of the bolt 180 and the pem-nut 190 through the holes of the shield unit 170 and the circuit unit 162 will be described with reference to FIG. 4.

Figure 4:
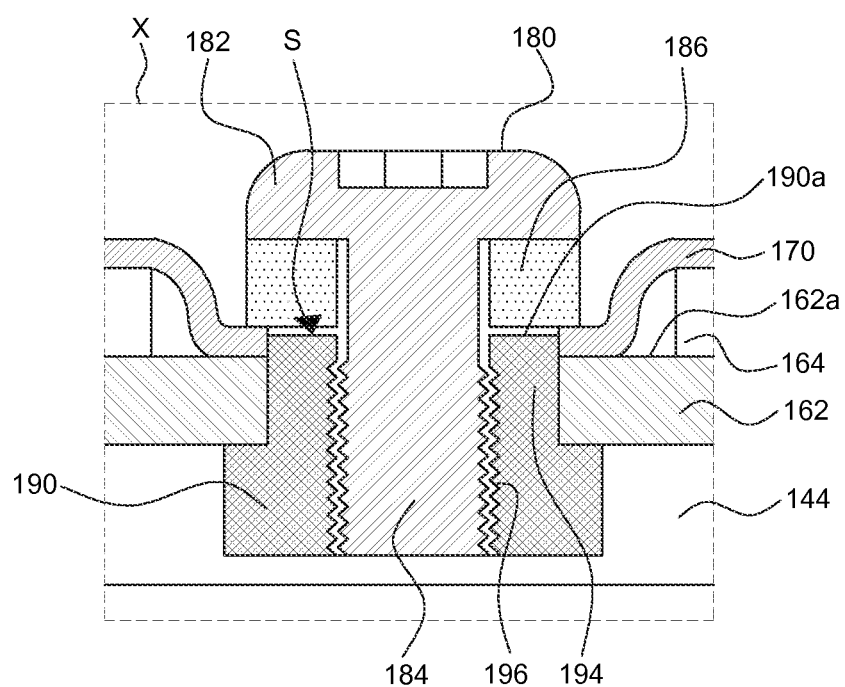
FIG. 4 is an enlarged cross-sectional view of the area X of FIG. 2.

FIG. 4 is an enlarged cross-sectional view of the area X of FIG. 2. The pem-nut 190 is mounted within the second chassis 144. The pem-nut 190 may be formed as one body with the second chassis 144, but is not limited thereto, and may be a separate part to be connected with the second chassis 144. The pem-nut 190 includes the protruding portion 194 protruded to an upper part of the second chassis 144. Further, a bolt-insertion part 196 including a screw groove for fastening to the bolt 180 is formed inside the protruding portion 194. The circuit unit 162 and the shield unit 170 includes the holes which penetrate the pem-nut 190 or allow the pem-nut 190 to pass through, and a top side 190a of the pem-nut 190 is exposed through the holes of the circuit unit 162 and the shield unit 170.

In the liquid crystal display apparatus 100 according to an exemplary embodiment of the present disclosure, a lateral side of the pem-nut 190 is configured to be in contact with the shield unit 170. For example, the top side 190a of the pem-nut 190 is positioned to be higher than a top side 162a of the circuit unit 162. In a liquid crystal display apparatus of the related art, a space where the shield unit 170 can be moved is present on the pem-nut 190. Therefore, the shield unit 170 can be moved within the space by an external impact or a stress of the flexible substrate 130. However, in the liquid crystal display apparatus 100 according to an exemplary embodiment of the present disclosure, since the top side 190a of the pem-nut 190 is positioned to be higher than the top side 162a of the circuit unit 162, a vertical length of a space S is smaller than thickness of the shield unit 170. Thus, the shield unit 170 cannot be positioned within the space S. Therefore, when the lateral side of the pem-nut 190 is in contact with the shield unit 170, even if the shield unit 170 is applied with a pressure in a horizontal direction by a stress of the flexible substrate 130, the shield unit 170 is fixed without being pushed by the pem-nut 190. Since the shield unit 170 is fixed, a very small distance between the shield unit 170 and another component in the thin liquid crystal display apparatus 100 can be secured. Therefore, a failure rate of the liquid crystal display apparatus 100 can be reduced and the durability of the liquid crystal display apparatus 100 can be improved.

The bolt 180 for fixing the shield unit 170 is fastened to the bolt-insertion part 196 of the pem-nut 190. Further, the annular ring 186 is disposed between the bolt 180 and the pem-nut 190. Since the bolt 180 is fastened to the pem-nut 190, the head of the bolt 180 applies a vertical directional pressure to the shield unit 170 through the annular ring 186 and fixes the shield unit 170. The annular ring 186 is in contact with a top side of the shield unit 170 and a top side of the pem-nut 190, and at least a part of the head portion 182 of the bolt 180 is overlapped with the shield unit 170. Therefore, the shield unit 170 is fixed by a pem-nut 290 and also, the shield unit 170 is fixed by being pressed by a bolt 280, so that the shield unit 170 may not be deviated from a position as designed. Therefore, the shield unit 170 can be accurately fixed at a position as designed by the pem-nut 190 and the vertical directional pressure of the bolt 180 and the pem-nut 190.

In the liquid crystal display apparatus 100 according to an exemplary embodiment of the present disclosure, as illustrated in FIG. 1 to FIG. 4, the top side 190a of the pem-nut 190 is positioned to be higher than the top side 162a of the circuit unit 162 and the shield unit 170 is fixed by the pem-nut 190. Therefore, it is possible to maintain a position of the shield unit 170 required by the thin liquid crystal display apparatus 100 and thus minimize a collision between the components. Further, it is difficult for the shield unit 170 to move, and, thus, the reliability of the liquid crystal display apparatus 100 with respect to an impact from the outside can be improved.

Figure 5:
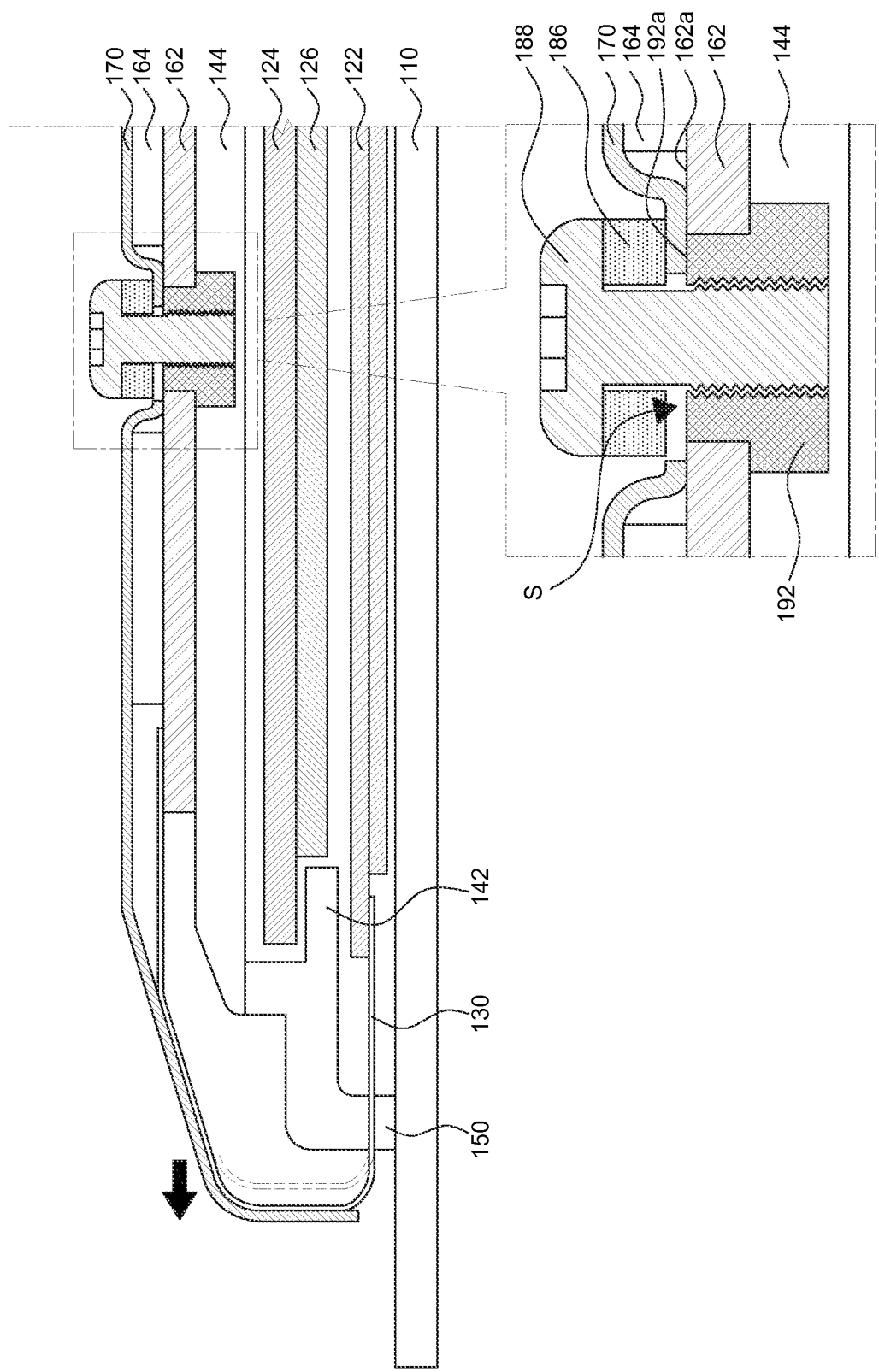
FIG. 5 is a schematic cross-sectional view of an exemplary liquid crystal display apparatus for describing a pushing of a shield unit.

FIG. 5 is a schematic cross-sectional view of an exemplary liquid crystal display apparatus for describing a pushing of a shield unit. In FIG. 5, since a bolt 188 and a pem-nut 192 are fastened to each other, the circuit unit 162 and the shield unit 170 can be fixed at positions as designed on the second chassis 144. To be specific, since the bolt 188 is fastened to the pem-nut 192, the bolt 188 presses the shield unit 170 and the circuit unit 162 through the annular ring 186, so that the shield unit 170 and the circuit unit 162 are fixed at positions as designed.

In an exemplary liquid crystal display apparatus illustrated in FIG. 5, a top side 192a of the pem-nut 192 is on the same plane as the top side 162a of the circuit unit 162. Therefore, in the exemplary liquid crystal display apparatus, a space S is present between the pem-nut 192 and the annular ring 186. The space between the pem-nut 192 and the annular ring 186 may be small, but may affect a connection between the housing and the liquid crystal display apparatus 100 since a part of the shield unit 170 is moved to the space S.

FIG. 5 illustrates the exemplary liquid crystal display apparatus in which the shield unit 170 is moved as much as a predetermined length. Referring to FIG. 5, the flexible substrate 130 applies a pressure to the shield unit 170 toward the outside of the liquid crystal display apparatus 100 by a restoring force of the bent flexible substrate 130. That is, the force for pushing the shield unit 170 by the restoring force of the flexible substrate 130 may be greater than a force for fixing the shield unit 170 by fastening of a pem-nut 184 to a bolt 188. Therefore, in FIG. 5, a part of the shield unit 170 is moved toward the outside of the liquid crystal display apparatus 100. That is, the shield unit 170 can be horizontally moved by a force for restoring the flexible substrate 130 to a state before the flexible substrate 130 is bent. In this case, since the shield unit 170 is horizontally moved, the shield unit 170 may be at an outer position from the liquid crystal display apparatus as compared with a position as designed.

If the shield unit 170 is deviated from the position as designed, there may be a problem of assembling a thin liquid crystal display apparatus. In the thin liquid crystal display apparatus, a designed distance between an external module such as a camera module to be connected or a housing such as a back cover and the shield unit 170 may be several mm. However, as illustrated in FIG. 5, if the shield unit 170 is moved without being fixed at a position as designed, the shield unit 170 may be overlapped with the housing or the external module in position. An overlapped position may cause the housing or the external module not to be assembled in the liquid crystal display apparatus 100. Otherwise, even if it is assembled, a failure of generating an undesired distance may be caused.

Thus, the liquid crystal display apparatus according to an exemplary embodiment of the present disclosure as illustrated in FIG. 3 includes the pem-nut 190 having the top side 190a positioned to be higher than the top side 162a of the circuit unit 162, so that the space S where the shield unit 170 can be moved is limited, thereby fixing the shield unit 170 at a desired position, and, thus, a distance between the shield unit 170 and other components can be secured. Further, a thinner liquid crystal display apparatus may be provided. Further, the shield unit 170 is fixed by fastening of the pem-nut 190 to the bolt 180 and also, a pushing of the shield unit 170 is minimized. Thus, a change in a position of the shield unit 170 is minimized, thereby minimizing a change in position of the shield unit 170 caused by an external impact or vibration.

Figure 6A:
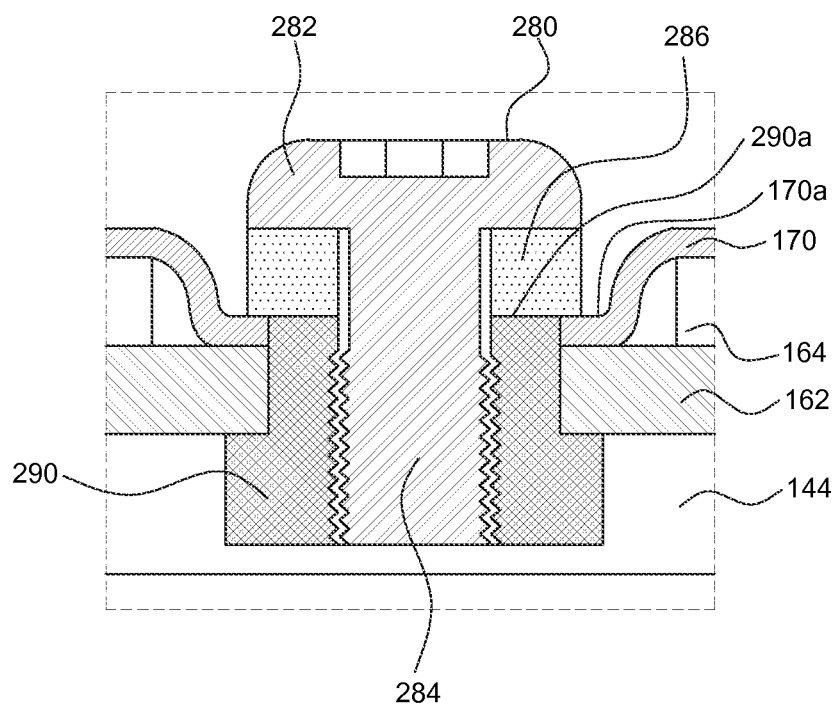
FIG. 6A to FIG. 6C are enlarged cross-sectional views of a liquid crystal display apparatus according to various exemplary embodiments of the present disclosure.
Figure 6B:
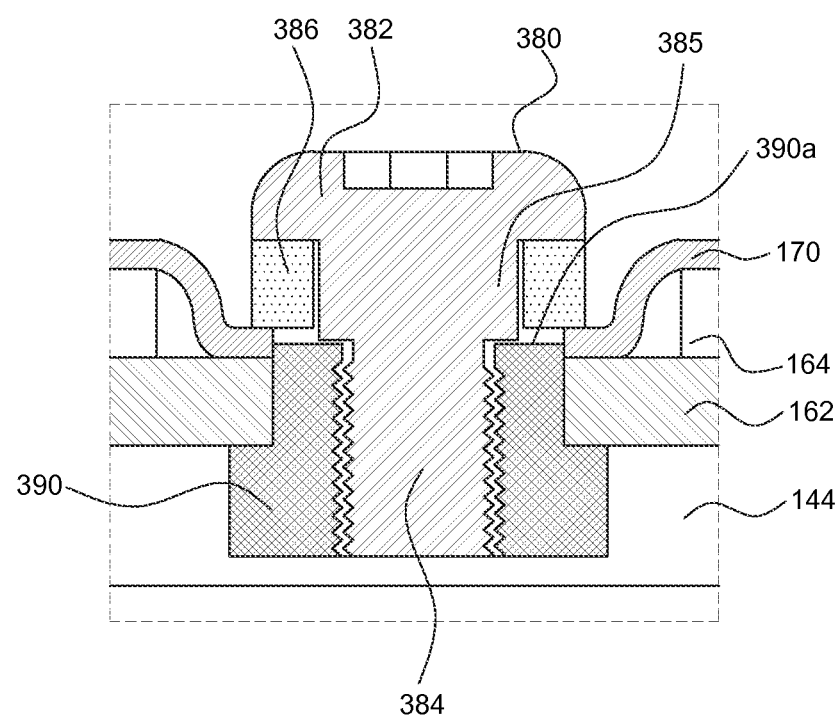
Figure 6C:
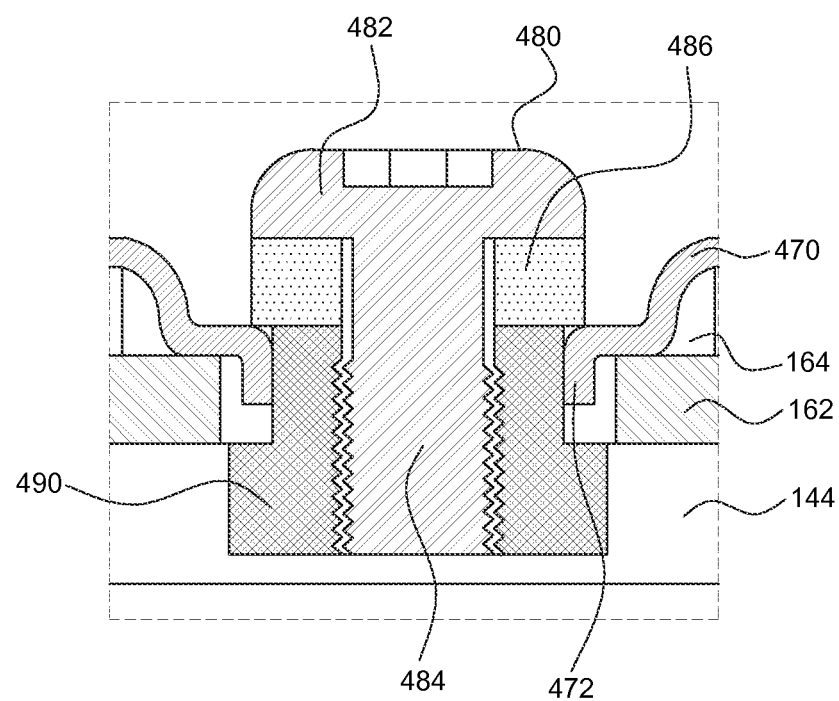

FIG. 6A to FIG. 6C are enlarged cross-sectional views of a liquid crystal display apparatus according to various exemplary embodiments of the present disclosure. The liquid crystal display apparatus 100 illustrated in FIG. 6A to FIG. 6C includes a fastening structure including a pem-nut, a bolt, and a shield unit modified to fix a position of the shield unit 170.

Referring to FIG. 6A, a top side 290a of the pem-nut 290 is positioned on the same plane as a top side 170a of the shield unit 170. That is, the pem-nut 290 is in contact with a lateral side of the shield unit 290, and the top side 290a of the pem-nut 290 and the top side 170a of the shield unit 170 are in contact with the annular ring 286 at the same time. Thus, the pem-nut 290 completely fills a space between the shield unit 170 and the bolt 180 and a lateral side of the pem-nut 290 is in contact with the shield unit 170, so that the hole of the shield unit 170 is filled with the pem-nut 290 without a space therebetween. Therefore, even if an external impact is applied, a position of the shield unit 170 is more stably maintained due to the pem-nut 290. Otherwise, although not illustrated in the drawings, the top side 290a of the pem-nut 290 may be positioned to be higher than the top side 170a of the shield unit 170. Even when the top side 290a of the pem-nut 290 is positioned to be higher than the top side 170a of the shield unit 170, if there is no space in the hole of the shield unit 170 where the pem-nut 290 is inserted, the shield unit 170 is fixed.

Referring to FIG. 6B, a bolt 380 further includes a shoulder unit 385 configured to be in contact with a top side 390a of a pem-nut 390. The shoulder unit 385 of the bolt 380 is formed by protruding a part of a body portion 384 of the bolt 380 and may have a greater width than the pem-nut 390 fastened to the body portion 384. The shoulder unit 385 of the bolt 380 allows a head portion 382 of the bolt 380 to be separated as much as thickness of the shoulder unit 385 from the pem-nut 390 when the bolt 380 is fastened to the pem-nut 390. Further, when the bolt 380 is fastened, the shoulder unit 385 may spread out on the top side 390a of the pem-nut 390. Therefore, the bolt 380 including the shoulder unit 385 limits a pressure, which is applied to the shield unit 170 when fastened, to a predetermined range. Therefore, it is possible to minimize damage to the shield unit 170 or the circuit unit 162 under the shield unit 170.

Accordingly, if an upper part of the pem-nut 390 is extended to the shield unit 170 and also, the bolt 380 includes the shoulder unit 385, it is possible to minimize damage to the shield unit 170 and the circuit unit 162 and also possible to improve a fixing force with respect to the shield unit 170 and the circuit unit 162.

On an inner peripheral surface of a fastening hole of a shield unit 470 or a cover, a burring structure may be realized. Referring to FIG. 6C, the shield unit 470 corresponding to a pem-nut 490 includes a portion 472 in which an end portion of the hole is bent toward the second chassis 144. If the shield unit 470 includes the portion 472 in which the hole is bent, the bent portion 472 is extended between the circuit unit 162 and the pem-nut 490. Therefore, the hole of the circuit unit 162 may be increased in width in order to secure a space for the bent portion 472.

The bent portion 472 of the hole is in direct contact with the pem-nut 490. Thus, a contact area of the shield 470 with respect to the pem-nut 490 increases. Therefore, a movement caused by a pushing of the shield unit 470 or deformation of the shield unit 470 is further limited. Also, if a strong impact is applied from the outside, the bent portion 472 is more easily caught by a head portion 482 of a bolt 480. Thus, it is possible to minimize deviation of the shield unit 470 from a shied unit-fixing structure including the bolt 480 and the pem-nut 490.

In the liquid crystal display apparatus 100 according to various exemplary embodiments of the present disclosure, as illustrated in FIG. 6A to FIG. 6C, the pem-nut, the bolt, and the shield unit are modified in shape, so that position fixing of the shield unit 470 required for the thin liquid crystal display apparatus 100 can be more stably achieved. That is, as illustrated in FIG. 6A, since the top side 290a of the pem-nut 290 is on the same plane as the top side 170a of the shield unit 170, the pem-nut 290 can more stably fix the shield unit 170. As illustrated in FIG. 6B, since the bolt 380 includes the shoulder unit 385, the shield unit 170 can be stably fixed without damaging the shield unit 170. Further, as illustrated in FIG. 6C, since the shield unit 470 includes the bent portion 472, the shield unit 470 can be brought into a closer contact with the pem-nut 490 and thus can be stably fixed. Further, if the structures of FIG. 6A to FIG. 6C are used, the durability against damage caused by fastening the bolt and any external impact can be improved.

Figure 7:
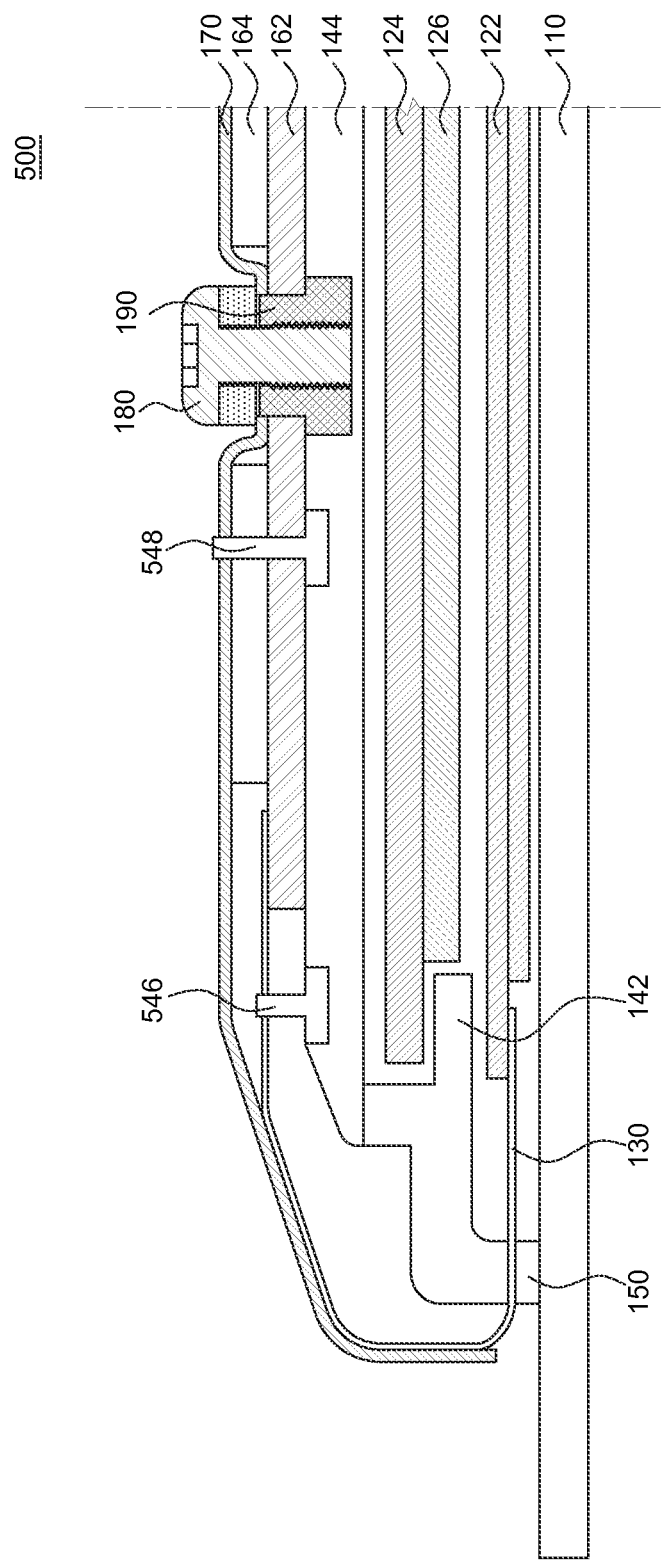
FIG. 7 is a schematic cross-sectional view of a liquid crystal display apparatus according to another exemplary embodiment of the present disclosure.

FIG. 7 is a schematic cross-sectional view of a liquid crystal display apparatus according to another exemplary embodiment of the present disclosure. A liquid crystal display apparatus 500 illustrated in FIG. 7 is substantially the same as the liquid crystal display apparatus 100 illustrated in FIG. 2 except that fixture pins 546 and 548 are added, and, thus, redundant explanation thereof will be omitted.

Referring to FIG. 7, the second chassis 144 includes the fixture pins 546 and 548 provided within the second chassis 144. The fixture pins 546 and 548 are pins for fixing the components on the second chassis 144. Each of the shield unit 170, the flexible substrate 130, and the circuit unit 162 includes holes corresponding to the fixture pins 546 and 548. The fixture pins 546 and 548 are respectively inserted into the holes of the shield unit 170, the flexible substrate 130, and the circuit unit 162. Herein, the fixture pin 548 is positioned in a region for the circuit unit 162 where the electric part 164 is not formed. The fixture pins 546 and 548 include protruding portions penetrating the corresponding holes, and the fixture pins 546 and 548 penetrating the shield unit 170, the flexible substrate 130, and the circuit unit 162 maintain the positions of the components not to be influenced by an external impact. In order to more accurately fix the positions of the components, the holes of each component may have the same size and shape as the protruding portions of the fixture pins 546 and 548.

In FIG. 7, the fixture pin 546 fixes the flexible substrate 130, but is not limited thereto. The fixture pin 546 may penetrate the shield unit 170 overlapped with the flexible substrate 130 and fix the shield unit 170 together with the flexible substrate 130. The other fixture pin 548 may penetrate the shield unit 170 and the circuit unit 162 overlapped with the shield unit 170 and fix the shield unit 170 and the circuit unit 162.

The liquid crystal display apparatus 500 may further include a cover unit configured to cover the fixture pins 546 and 548 penetrating the shield unit 170. The cover unit itself does not fix the shield unit 170, but can suppress deviation of the shield unit 170 or the like from the fixture pins 546 and 548 when an impact is applied from the outside.

As illustrated in FIG. 7, the fixture pins 546 and 548 may be subsidiarily used in the shield unit-fixing structure including the bolt 180 and the pem-nut 190 and make it easy to fix the shield unit 170, but are not limited thereto. The liquid crystal display apparatus 500 may use only the fixture pins 546 and 548 without using the shield unit-fixing structure in order to fix the shield unit 170 at a position as designed.

In the liquid crystal display apparatus 500 according to another exemplary embodiment of the present disclosure, as illustrated in FIG. 7, the fixture pins 546 and 548 are included, so that it is possible to more easily fix the flexible substrate 130, the circuit unit 162 and the shield unit 170. Therefore, it is possible to reduce a pushing of the components caused by a stress of the flexible substrate 130.

Figure 8:
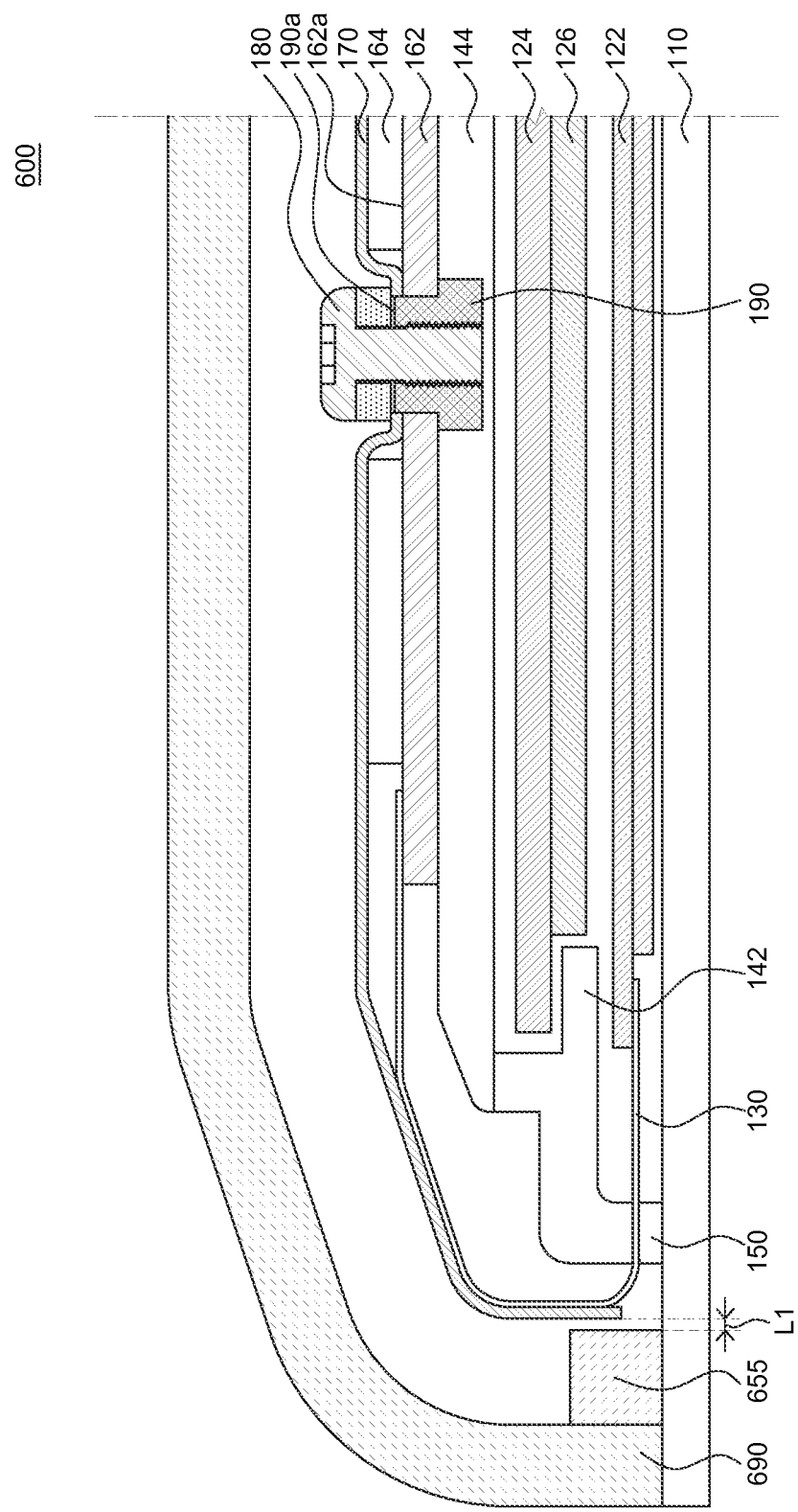
FIG. 8 is a cross-sectional view for describing a connection of a liquid crystal display apparatus according to an exemplary embodiment of the present disclosure with a housing.

FIG. 8 is a cross-sectional view for describing a connection of a liquid crystal display apparatus according to an exemplary embodiment of the present disclosure with a housing. A liquid crystal display apparatus 600 illustrated in FIG. 8 is substantially the same as the liquid crystal display apparatus 100 illustrated in FIG. 2 except that a housing 690 and an external module 655 are added, and, thus, redundant explanation thereof will be omitted.

Referring to FIG. 8, the liquid crystal display apparatus 600 includes the housing 690 configured to surround the shield unit 170 and the external module 655. The external module 655 is a separately manufactured module such as a camera module and may be connected with the liquid crystal display apparatus 600. The housing 690 may be a back cover configured to block an impact, water, dust, and the like from the outside.

In the liquid crystal display apparatus 600, a distance L1 between the external module 655 and the shield unit 170 may be designed or set to several mm in order to realize the thin liquid crystal display apparatus 600. In the liquid crystal display apparatus 600 according to an exemplary embodiment of the present disclosure, since the top side 190*a* of the pem-nut 190 is positioned to be higher than the top side 162*a* of the circuit unit 162, the hole of the shield unit 170 is in direct contact with the pem-nut 190. Therefore, a space where the shield unit 170 can be moved disappears. Thus, even if the shield unit 170 is pushed by a stress of the flexible substrate 130, a position of the shield unit 170 is fixed by the pem-nut 190. Accordingly, since the shield unit 170 is not pushed, the shield unit 170 does not invade into a predetermined position of the external module 655 and a desired distance between the shield unit 170 and the external module 655 can be maintained. Further, since the external module 655 is maintained at a position as designed, the housing 690 can also be connected at a desired position and a separation between the housing 690 and the transparent plate 110 caused by a pushing of the shield unit 170 does not occur.

However, without limitation thereto, various structures of the pem-nut, bolt, and shield unit described in the present specification may be used in the liquid crystal display apparatus 600. All of the modified structures of the pem-nut, bolt, and shield unit can more stably fix the pem-nut and the shield unit. Therefore, the frequency of separation failure which may occur while manufacturing a liquid crystal display apparatus can be reduced, and a reduction in durability of a liquid crystal display apparatus caused by an impact can be minimized.

Hereinafter, there will be described a liquid crystal display apparatus according to an exemplary embodiment in which even if a force is applied to a fixing structure for fixing a shield unit, a distance between components is maintained. The liquid crystal display apparatus according to an exemplary embodiment of the present disclosure as described below realizes a liquid crystal display apparatus having a smaller thickness and also minimizes introduction of particles from the outside while suppressing the components of the liquid crystal display apparatus from being overlapped with each other.

Figure 9:
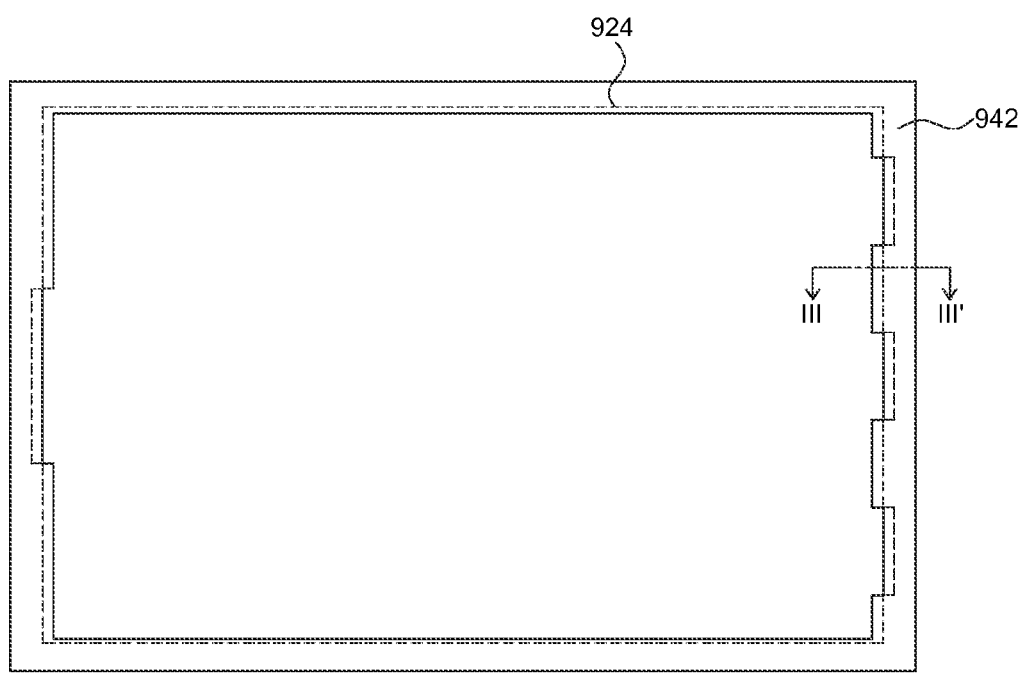
FIG. 9 is a schematic plan view for describing a liquid crystal display apparatus according to another exemplary embodiment of the present disclosure.
Figure 10:
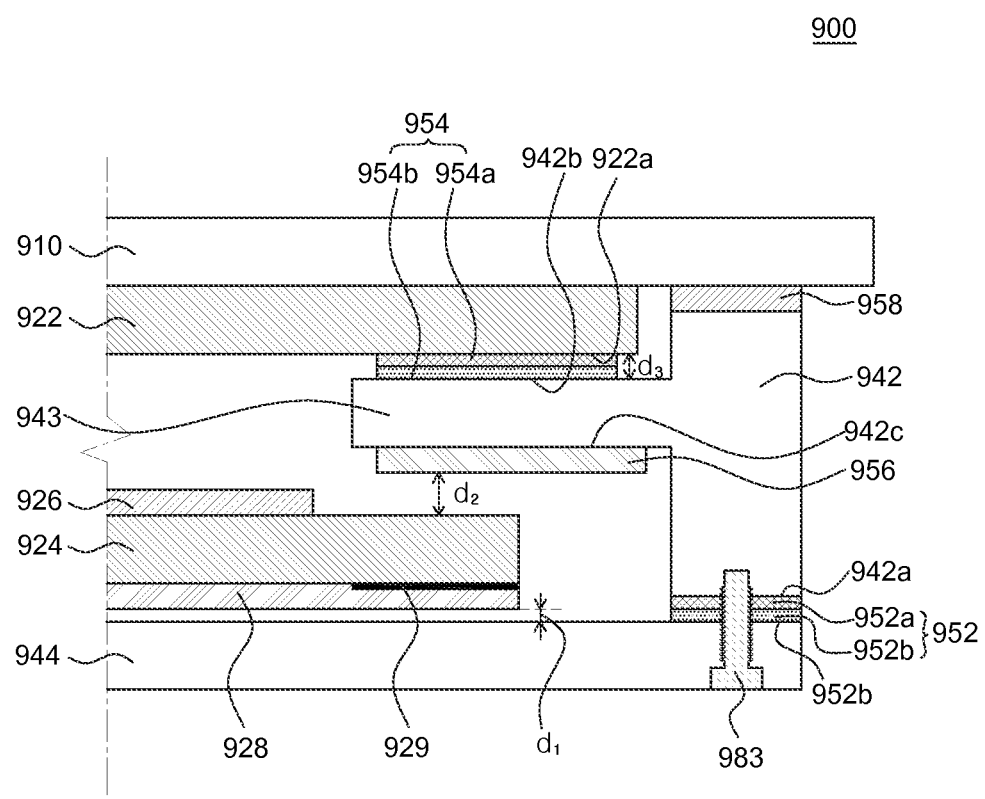
FIG. 10 is a schematic cross-sectional view of the liquid crystal display apparatus taken along a line of FIG. 9.

FIG. 9 is a schematic plan view for describing a liquid crystal display apparatus according to another exemplary embodiment of the present disclosure. FIG. 10 is a schematic cross-sectional view of the liquid crystal display apparatus taken along a line III-III' of FIG. 9. For convenience in explanation, FIG. 9 illustrates only a liquid crystal display panel 922 and a first chassis 942 configured to surround the liquid crystal display panel 922. Further, for convenience in explanation, FIG. 10 illustrates that a transparent plate 910 is disposed on an upper side and the second chassis 944 is disposed on a lower side, unlike FIG. 2.

Referring to FIG. 9 and FIG. 10, a liquid crystal display apparatus 900 includes a first chassis 942, the second chassis 944, a first pad unit 952, a second pad unit 954, a third pad unit 956, the transparent plate 910, an adhesive layer 958, the liquid crystal display panel 922, a light guide plate 924, a reflector 928, an optical layer 926, and a fastening unit 983.

The transparent plate 910 bonded to a top side of the liquid crystal display panel 922 is disposed on the liquid crystal display panel 922. The transparent plate 910 is bonded to the liquid crystal display panel 922. Since a liquid crystal display apparatus of the related art includes a cover unit, a liquid crystal display panel is exposed to the outside. However, a structuring including a cover unit has a limit in manufacturing a thinner liquid crystal display apparatus due to thickness of the cover unit. Accordingly, if the cover unit is removed, it is possible to reduce a thickness of the liquid crystal display apparatus and reduce a bezel portion, which does not emit light, in the liquid crystal display apparatus. However, since the cover unit is removed, the liquid crystal display panel may be detached or may be exposed to any impact. Thus, in the liquid crystal display apparatus 900 according to an exemplary embodiment of the present disclosure as illustrated in FIG. 10, there is used a structure in which the transparent plate 910 is formed on the liquid crystal display panel 922 and the liquid crystal display panel 922 is bonded to a bottom side of the transparent plate 910.

The light guide plate 924 is disposed under the liquid crystal display panel 922. The light guide plate 924, for example, is a component configured to guide a light of a backlight such as an LED (light emitting diode) disposed on a lateral side of the liquid crystal display apparatus 900 to be uniformly irradiated in a direction in which the liquid crystal display panel 922 is disposed.

The optical layer 926 that transmits light from the light guide plate 924 is formed on the light guide plate 924. The optical layer 926 may be a single layer or may be a plurality of layers performing various optical functions. The optical layer 926 may perform, for example, a function of concentrating light or a function of dispersing light.

The reflector 928 is disposed under the light guide plate 924. The reflector 928 reflects light irradiated to a lower side of the light guide plate 924 among lights of the backlight passing through the light guide plate 924 toward the liquid crystal display panel 922. At an edge portion of the reflector 928, an ink portion 929 is formed. At the edge portion of the reflector 928, a part of light from the backlight and a part of light passing through the light guide plate may be reflected in an undesired direction. Therefore, since the ink portion 929 printed with black ink is formed at the edge portion of the reflector 928, it is possible to suppress reflection of light in an undesired direction at the edge portion.

Meanwhile, the reflector 928 is a plate formed of a metal having a high reflectivity or an alloy of various metals. Therefore, the reflector 928 may be contracted or expanded according to a change in temperature and/or humidity. For example, the reflector 928 may be expanded at a high temperature and/or in a high-temperature condition. If the reflector 928 adheres to at least a part of the light guide plate 924, a wrinkling phenomenon may occur in the reflector 928 due to a stress generated when the reflector 928 is expanded. If the wrinkling phenomenon occurs, a light reflected by the reflector 928 may not be uniformly irradiated to the liquid crystal display panel 922. In other words, if the ink portion 929 of the reflector 928 is brought into close contact with the light guide plate 924 by a protruding portion 943 of the first chassis 942 or another component of the liquid crystal display apparatus 900 and the ink portion 929 is exposed to a high-temperature or high-humidity condition, the ink portion 929 may be melted and increased in adhesion and thus may adhere to the light guide plate 924. In this case, a wrinkling phenomenon may occur. However, in the liquid crystal display apparatus 900 according to an exemplary embodiment of the present disclosure, the ink portion 929 of the reflector 928 does not adhere to the light guide plate 924 and the reflector 928 has a circumferential space for contraction or expansion.

Meanwhile, FIG. 10 illustrates that the ink portion 929 of the reflector 928 is in contact with the light guide plate 924, but the ink portion 929 of the reflector 928 may not be in contact with the light guide plate 924 and may be separated from the light guide plate 924 by a predetermined distance sufficient for contraction or expansion. The light guide plate 924 and the reflector 928 are supported by components which are not illustrated in FIG. 10, and the components supporting the light guide plate 924 and the reflector 928 may be connected with the second chassis 944 or the first chassis 942.

Referring to FIG. 10, the second chassis 944 is disposed at a lower end of the liquid crystal display apparatus 900. The second chassis 944 suppresses a foreign material from being introduced from a lower side of the liquid crystal display apparatus 900 and protects the liquid crystal display apparatus 900 against an impact or the like. The second chassis 944 is positioned to be lower than the liquid crystal display panel 922 and the reflector 928. FIG. 10 illustrates that a top side and a bottom side of the second chassis 944 are flat, but without limitation thereto, the top side and the bottom side of the second chassis 944 may have a protruding edge portion or may have a structure for supporting various components depending on a design. If the second chassis 944 is formed of a metal, a part of the second chassis 944 may be insulated in order to suppress an electrical connection with the other components. FIG. 10 illustrates that the second chassis 944 is separated from the reflector 928, but without limitation thereto, the reflector 928 may be adjacent to or in contact with the second chassis 944. However, if the reflector 928 is in contact with the second chassis 944, the reflector 928 and the second chassis 944 may not be bonded to each other in order for the reflector 928 to be freely contracted or expanded by heat or humidity.

The first edge 942 including a portion perpendicular to the second chassis 944 is disposed on an edge of the second chassis 944. The first chassis 942 surrounds the liquid crystal display panel 922 and protects the liquid crystal display apparatus 900 by suppressing a foreign material from being introduced from a lateral side of the liquid crystal display apparatus 900. A top side of the first chassis 942 is bonded to the transparent plate 910 via the adhesive layer 958. The first chassis 942 includes a first surface 942a facing an edge surface 944a of the second chassis 944, and the first pad unit 952 is interposed between the first surface 942a and the edge surface 944a. The first chassis 942 may be formed of, for example, a plastic material in order to suppress a short with respect to the other components such as a circuit unit.

Referring to FIG. 9, the first chassis 942 is overlapped in part with the liquid crystal display panel 922 and surrounds the liquid crystal display panel 922. The first chassis 942 is illustrated as a single chassis in FIG. 9, but may be formed as being divided into a plurality of chassis such as a left chassis, a right chassis, an upper chassis, and a lower chassis. Further, the first chassis 942 is not limited to the shape as illustrated in FIG. 9, but may have various shapes in a plan view depending on positions or sizes of an FPCB (flexible printed circuit board), a circuit unit, a backlight, and the like, bonded to the liquid crystal display panel 922.

The first chassis 942 includes the protruding portion 943 protruding toward the liquid crystal display panel 922 and positioned under the liquid crystal display panel 922. The protruding portion 943 is positioned between the liquid crystal display panel 922 and the light guide plate 924, and includes a second surface 942b facing the liquid crystal display panel 922 and a third surface 942c facing the light guide plate 924. The first chassis 942 may separate positions of various components within the liquid crystal display apparatus 900. Further, the second pad unit 954 and the second pad unit 956 may be disposed on the first chassis 942 in order to block particles which may be introduced into a space between the components, suppress other components such as the light guide plate 924 and the liquid crystal display panel 922 from being overlapped in position with the first chassis 942, and perform a buffering function.

The third pad unit 956 is formed on a bottom side of the protruding portion 943 of the first chassis 942. The third pad unit 956 is a pad unit configured to relieve an impact when the light guide plate 924 collides with the first chassis 942 by a physical impact. A material of the third pad unit 956 is not limited and may not be included in the liquid crystal display apparatus 900 depending on a design.

A shape of the first chassis 942 illustrated in FIG. 10 is just an example but is not limited thereto. For example, the first chassis 942 may include the second surface 942b facing the liquid crystal display panel 922 without including the protruding portion 943. That is, the first chassis 942 may have a step shape. In this case, the third surface 942c may not be present depending on a design.

The first pad unit 952 is disposed between the first surface 942a of the second chassis 944 and the edge surface 944a of the first chassis 942. The first pad unit 952 blocks a foreign material which may be introduced between the second chassis 944 and the first chassis 942. Further, the first pad unit 952 secures a minimum distance between the second chassis 944 and the reflector 928 and a minimum distance between the first chassis 942 and the light guide plate 924. Herein, the minimum distance between the second chassis 944 and the reflector 928 refers to a distance sufficient to separate the second chassis 944 and the reflector 928 but not to bond the ink portion 929 to the light guide plate 924. Further, the minimum distance between the first chassis 942 and the light guide plate 924 refers to a distance sufficient for the protruding portion 943 of the first chassis 942 not to press the light guide plate 924 in order for the ink portion 929 not to be bonded to the light guide plate 924. Therefore, in the liquid crystal display apparatus 900 according to an exemplary embodiment of the present disclosure, thickness of the first pad unit 952 may be adjusted in order to secure the minimum distance between the second chassis 944 and the reflector 928 and the minimum distance between the first chassis 942 and the light guide plate 924.

The first pad unit 952 includes a foam pad layer 952a and a rigid layer 952b. The foam pad unit 925a refers to a pad unit having certain thickness and capable of being compressed to predetermined thickness when being applied with a pressure. For example, the foam pad unit 952a may be a pad unit having thickness of 0.4 mm, interposed between the first surface 942a of the second chassis 944 and the edge surface 944a of the first chassis 942, and compressed to a thickness of 0.1 mm when being applied with a pressure. The foam pad layer 952a may be formed of a polymer material, for example, such as polypropylene and a polyester-based material. If the foam pad layer 952a is overlapped in position with the other components of the liquid crystal display apparatus 900, a part of the foam pad layer 952a may be contracted by a pressure. Since a part of the foam pad layer 952a is contracted, an impact applied to a component on the other side of another component overlapped in position is absorbed. Therefore, the foam pad layer 952a blocks a foreign material from the outside by being interposed between the first chassis 942 and the second chassis 944 and also further absorbs an impact from the outside than other solid materials.

The rigid layer 952b is a layer for adjusting thickness of the first pad unit 952. The rigid layer 952b is substantially not changed in thickness even when compression sufficient to reduce thickness of the foam pad layer 952a is applied. Since the first pad unit 952 includes both of the foam pad layer 952a and the rigid layer 952b, the first pad unit 952 absorbs an impact from the outside and blocks a foreign material from the outside while adjusting a distance between the second chassis 944 and the reflector 928 and a distance between the first chassis 942 and the light guide plate 924.

The rigid layer 952b is formed of a polymer material such as PET (polyethylene terephthalate), PE (polyethylene), and PC (polycarbonate). Thickness of the rigid layer 952b may be determined on the basis of a distance between the components of the liquid crystal display apparatus 900. That is, thickness of the rigid layer 952b may be determined depending on a desired distance between the reflector 928 and the second chassis 944 or a desired distance between the third pad unit 956 and the light guide plate 924. For example, referring to FIG. 10, thickness of the rigid layer 952b may be determined as thickness obtained by subtracting thickness of the foam pad layer 952a from a sum of a minimum distance d1 between the reflector 928 and the second chassis 944 and a minimum distance d2 between the third pad unit 956 and the light guide plate 924. Otherwise, an edge portion of the reflector 928 including the ink portion 929 is separated from the second chassis 944 by a distance equal to or smaller than thickness of the rigid layer 952b. That is, the minimum distance d1 between the second chassis 944 may be equal to or smaller than a thickness of the rigid layer 952b. As a result, a distance between the components of the liquid crystal display apparatus 900 is secured by the rigid layer 952b. Accordingly, the light guide plate 924 is pressed by the first chassis 942 or another component, so that the ink portion 929 of the reflector 928 is bonded to the light guide plate 924 and a wrinkling phenomenon caused by thermal deformation of the reflector 928 can be solved. The rigid layer 952b may be formed on the foam pad layer 952a by coating. Even in this case, thickness of the rigid layer 952b is determined on the basis of the above-described factor, i.e., a minimum distance between the components. That is, the reflector 928 is formed with sufficient distances up and down to be thermally contracted and expanded by thickness of the rigid layer 952b.

Further, the minimum distance d2 between the third pad unit and the light guide plate may be smaller than thickness of the first pad unit 952. That is, the minimum distance d2 between the third pad unit 956 and the light guide plate 924 may be maintained by thickness of the first pad unit 952. Further, a sum d1+d2 of the minimum distance d1 between the reflector 928 and the second chassis 944 and the minimum distance d2 between the third pad unit 956 and the light guide plate 924 may be smaller than thickness of the first pad unit 952. In the same manner, a distance between the components can be secured by thickness of the first pad unit 952.

Further, the first pad unit 952 also performs a function of minimizing light leakage from the inside of the liquid crystal display apparatus 900. In the case of the liquid crystal display apparatus 100 of the related art having a structure in which a cover unit 130 and a part of a second chassis 110 cover a connection portion between the second chassis 110 and a first chassis 120 as illustrated in FIG. 1, a pad unit 122 performs only a function of blocking a foreign material from the outside. However, if at least a lateral side of the first pad unit 952 is positioned to be exposed to the outside as illustrated in FIG. 10d, the first pad unit 952 suppresses light leakage from the inside of the liquid crystal display apparatus 900. Therefore, the foam pad layer 952a and the rigid layer 952b of the first pad 952 may be black in color.

The second chassis 944 and the first chassis 942 are connected by the fastening unit 983. The fastening unit 983 may be a screw, a bolt, a nut, and the like. The fastening unit 983 penetrates the second chassis 944 and the first pad unit 952 to be fixed to the second pad unit 954. The foam pad layer 952a of the first pad unit 952 is compressed when the fastening unit 983 is tightened. The foam pad layer 952a to be compressed by the fastening unit 983 is compressed along a shape of the first chassis 942 in contact with the foam pad layer 952a, thereby minimizing a space through which particles are introduced from the outside. A lower end surface of the fastening unit 983 is on the same plane as a bottom side of the second chassis 944. Thus, a bottom side of the liquid crystal display apparatus 900 may be evenly formed on the whole.

Further, although not illustrated in FIG. 10, the first pad unit 952 may be formed not to be in contact with the fastening unit 983. For example, the first pad unit 952 may include a hole having an inner diameter greater than a diameter of the fastening unit 983 such that the fastening unit 983 as a circular screw and the first pad unit 952 cannot be in contact with each other.

Meanwhile, on the second surface 942b of the first chassis 942 facing the bottom side of the liquid crystal display panel 922, the second pad unit 954 is interposed between the first chassis 942 and the liquid crystal display panel 922. The second pad unit 954 is in contact with the bottom side of the liquid crystal display panel 922 in order to block a foreign material from the outside. As described above, since the liquid crystal display panel 922 is bonded to the bottom side of the transparent plate 910, the liquid crystal display panel 922 is physically separated from the protruding portion 943 of the first chassis 942. That is, the protruding portion 943 of the first chassis 942 does not support the liquid crystal display panel 922.

However, if there is a space between the first chassis 942 and the liquid crystal display panel 922, a foreign material may be introduced from the outside into the liquid crystal display apparatus 900, and the introduced foreign material may cause a short circuit or damage the components of the liquid crystal display apparatus 900. Thus, the second pad unit 954 may block a foreign material from the outside by filling the space between the first chassis 942 and the liquid crystal display panel 922.

The second pad unit 954 includes a foam pad layer 954a and a rigid layer 954b. The foam pad layer 954a and the rigid layer 954b are substantially the same as the foam pad layer 952a and the rigid layer 952b of the first pad unit 952, and, thus, detailed explanation thereof will be omitted. Hereinafter, an advantage of the second pad unit 954 with the foam pad layer 954a and the rigid layer 954b will be mainly described.

If the second pad unit 954 is formed of only one of the foam pad layer 954a or the rigid layer 954b, various problems may occur. When the second pad unit 954 is formed of only the foam pad layer 954a, the foam pad layer 954a may not be compressed or may be in contact with the liquid crystal display panel 922 while being compressed in part. Therefore, in this case, a foreign material from the outside may be blocked. However, the foam pad layer 954a may have damage such as a burr caused by peeling-off of a part of a surface of the foam pad layer 954a by a movement of the liquid crystal display panel 922 and various impacts. In this case, a foreign material from the foam pad layer 954a itself may be introduced into the liquid crystal display apparatus 900.

Otherwise, when the second pad unit 954 is formed of only the rigid layer 954b, if the rigid layer 954b is too thin, the foam pad layer 954a cannot be in contact with the bottom side of the liquid crystal display panel 922, and, thus, a foreign material may not be sufficiently blocked. Further, if the rigid layer 954b is too thick, the rigid layer 954b may apply a pressure to the liquid crystal display apparatus 900. Due to the pressure, alignment of a liquid crystal in the liquid crystal display panel 922 may be changed or an alignment force of a liquid crystal alignment layer may be decreased. In this case, while the liquid crystal display panel 922 is in a black state where any light is blocked, some of light may be leaked through the liquid crystal display panel 922 in the region where the second pad unit 954 is formed.

Such a light-leakage phenomenon can be solved when the second pad unit 954 includes both of the foam pad layer 954a and the rigid layer 954b. The second pad unit 954 including both of the foam pad layer 954a and the rigid layer 954b is in contact with the bottom side of the liquid crystal display panel 922 via the foam pad layer 954a. Further, thickness of the second pad unit 954 may be adjusted by adjusting thickness of the rigid layer 954b not to make a change in alignment of a liquid crystal in the liquid crystal display panel 922. That is, the second pad unit 954 suppresses light leakage caused by a change in alignment of a liquid crystal and also minimizes introduction of a foreign material from the outside. Further, if the rigid layer 954b is formed on the foam pad layer 954a, the rigid layer 954b covers a top side of the foam pad layer 954a, and, thus, a burr occurring on a contact surface between the foam pad layer 954a and the rigid layer 954b can be reduced.

Therefore, in the liquid crystal display apparatus 900 according to an exemplary embodiment of the present disclosure, as illustrated in FIG. 9 and FIG. 10, the first pad unit 952 or the second pad unit 954 includes the foam pad layer 952a or 954a and the rigid layer 952b or 954b, so that a distance between the components of the liquid crystal display apparatus 900 can be secured and also various impacts can be absorbed. Further, a wrinkling phenomenon of the reflector 928 and a light-leakage phenomenon of the liquid crystal display panel 922 are minimized, so that the durability of the liquid crystal display apparatus 900 can be improved.

FIG. 11 to FIG. 14 are schematic cross-sectional views for describing a pad unit of a liquid crystal display apparatus according to various exemplary embodiments of the present disclosure. FIG. 11 to FIG. 14 are diagrams for describing pad units 1152, 1252, 1352, and 1452 which respectively include foam pad layers 1152a, 1252a, 1352a, and 1452a and rigid layers 1152b, 1252b, 1352b, and 1452b and can be applied to the first pad unit 952 or the second pad unit 954 illustrated in FIG. 10. Although a first pad unit and a second pad unit are not illustrated for brevity in the drawings, the pad units 1152, 1252, 1352, and 1452 may be at the same positions as the above-described first pad unit 952 and/or the second pad unit 954 illustrated in FIG. 10.

Figure 11:
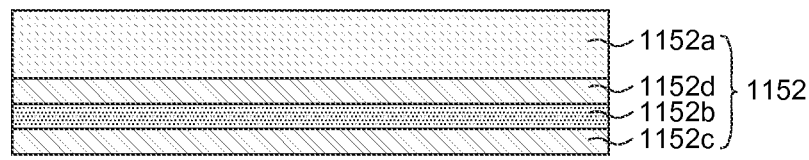
FIG. 11 to FIG. 14 are schematic cross-sectional views for describing a pad unit of a liquid crystal display apparatus according to various exemplary embodiments of the present disclosure.
Figure 12:
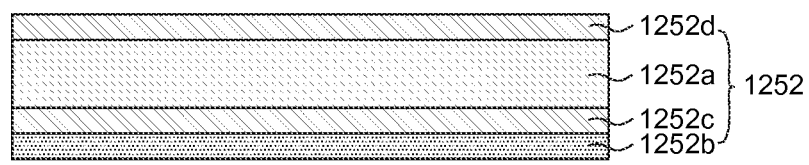

FIG. 11 and FIG. 12 illustrate exemplary embodiments in which the foam pad layers 1152a and 1252a are thicker than the rigid layers 1152b and 1252b, respectively. When the foam pad layers 1152a and 1252a are thicker than the rigid layers 1152b and 1252b, if the pad units 1152 and 1252 are applied between the liquid crystal display panel and the first chassis, the foam pad layer 1152a and 1252a having a buffering function are in close contact with the liquid crystal display panel and apply a small pressure to the liquid crystal display panel. Thus, it is possible to minimize a foreign material from being introduced from the outside without damaging the liquid crystal display panel. Referring to FIG. 11, a first adhesive layer 1152c is formed between the foam pad layer 1152a and the rigid layer 1152b. The first adhesive layer 1152c connects the foam pad layer 1152a with the rigid layer 1152b. A second adhesive layer 1152d is disposed under the rigid layer 1152b. The rigid layer 1152b is connected with the second chassis or the first chassis via the second adhesive layer 1152d. The foam pad layer 1252a, a first adhesive layer 1252c, and the rigid layer 1252b illustrated in FIG. 12 are the same as the foam pad layer 1152a, the first adhesive layer 1152c, and the rigid layer 1152b illustrated in FIG. 11 except that a position of a second adhesive layer 1252d is different. In FIG. 12, the foam pad layer 1252a is bonded to the second chassis or the first chassis via the second adhesive layer 1252d.

Figure 13:
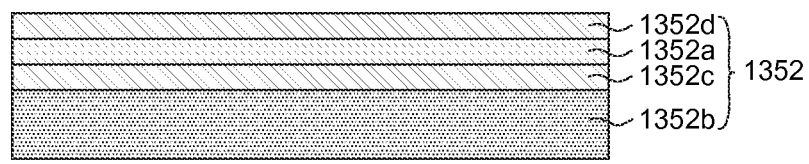
Figure 14:
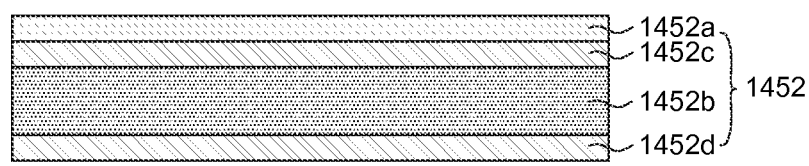

FIG. 13 and FIG. 14 illustrate exemplary embodiments in which the rigid layers 1352b and 1452b are thicker than the foam pad layers 1352a and 1452a, respectively. When the rigid layers 1352b and 1452b are thicker than the foam pad layers 1352a and 1452a, the foam pad layers 1352a and 1452a fill a space between the components and reduce a pressure applied to the components through the foam pad layers 1352a and 1452a, and also, a desired distance between the components can be secured by increasing thicknesses of the rigid layers 1352b and 1452b. Referring to FIG. 13, a first adhesive layer 1352c is formed between the foam pad layer 1352a and the rigid layer 1352b. The first adhesive layer 1352c connects the foam pad layer 1352a with the rigid layer 1352b. A second adhesive layer 1352d is disposed on the foam pad layer 1352a. The foam pad layer 1352a is connected with the second chassis or the first chassis via the second adhesive layer 1352d. The foam pad layer 1452a, a first adhesive layer 1452c, and the rigid layer 1452b illustrated in FIG. 14 are the same as the foam pad layer 1352a, the first adhesive layer 1352c, and the rigid layer 1352b illustrated in FIG. 13 except that a position of a second adhesive layer 1452d is different. In FIG. 14, the rigid layer 1452b is bonded to the second chassis or the first chassis via the second adhesive layer 1452d.

In FIG. 11 to FIG. 14, the first adhesive layers 1152c, 1252c, 1352c, and 1452c are layers for bonding the foam pad layers 1152a, 1252a, 1352a, and 1452a to the rigid layers 1152b, 1252b, 1352b, and 1452b, and the second adhesive layers 1152d, 1252d, 1352d, and 1452d are layers for bonding the components of the liquid crystal display apparatus to the pad layers 1152a, 1252a, 1352a, and 1452a. The pad layers 1152a, 1252a, 1352a, and 1452a are configured not to bond two components but to be bonded to one component in order to relieve an impact generated when being brought into contact with another component or maintain a distance from another component, and, thus, may not include adhesive layers on both sides thereof. The first adhesive layers 1152c, 1252c, 1352c, and 1452c or the second adhesive layers 1152d, 1252d, 1352d, and 1452d may be black in color. If the first adhesive layers 1152c, 1252c, 1352c, and 1452c or the second adhesive layers 1152d, 1252d, 1352d, and 1452d are formed of a black material, it is possible to minimize light leakage through the first adhesive layers 1152c, 1252c, 1352c, and 1452c or the second adhesive layers 1152d, 1252d, 1352d, and 1452d disposed at positions where light leakage is likely to occur. Further, FIG. 11 to FIG. 14 illustrate that the foam pad layers 1152a, 1252a, 1352a, and 1452a are disposed on an upper side, but the foam pad layers 1152a, 1252a, 1352a, and 1452a may be disposed on a lower side and the rigid layers 1152b, 1252b, 1352b, and 1452b may be disposed on an upper side depending on a design. In the liquid crystal display apparatus according to various exemplary embodiments of the present disclosure, the adhesive layer is disposed at various positions and the thicknesses of the foam pad layer and the rigid layer are adjusted, so that it is possible to easily adjust a distance between the components in the liquid crystal display apparatus.

Therefore, in the liquid crystal display apparatus according to various exemplary embodiments of the present disclosure, as illustrated in FIG. 11 to FIG. 14, the pad units 1152, 1252, 1352, and 1452 include the foam pad layers 1152a, 1252a, 1352a, and 1452a and the rigid layers 1152b, 1252b, 1352b, and 1452b different in thickness. Thicknesses required to be suitable for respective positions of the liquid crystal display apparatus and a buffering function of the foam pad layers 1152a, 1252a, 1352a, and 1452a can be achieved. Further, since the first adhesive layers 1152c, 1252c, 1352c, and 1452c or the second adhesive layers 1152d, 1252d, 1352d, and 1452d are formed of a black material, it is possible to minimize light leakage through the pad units 1152, 1252, 1352, and 1452.

Figure 15:
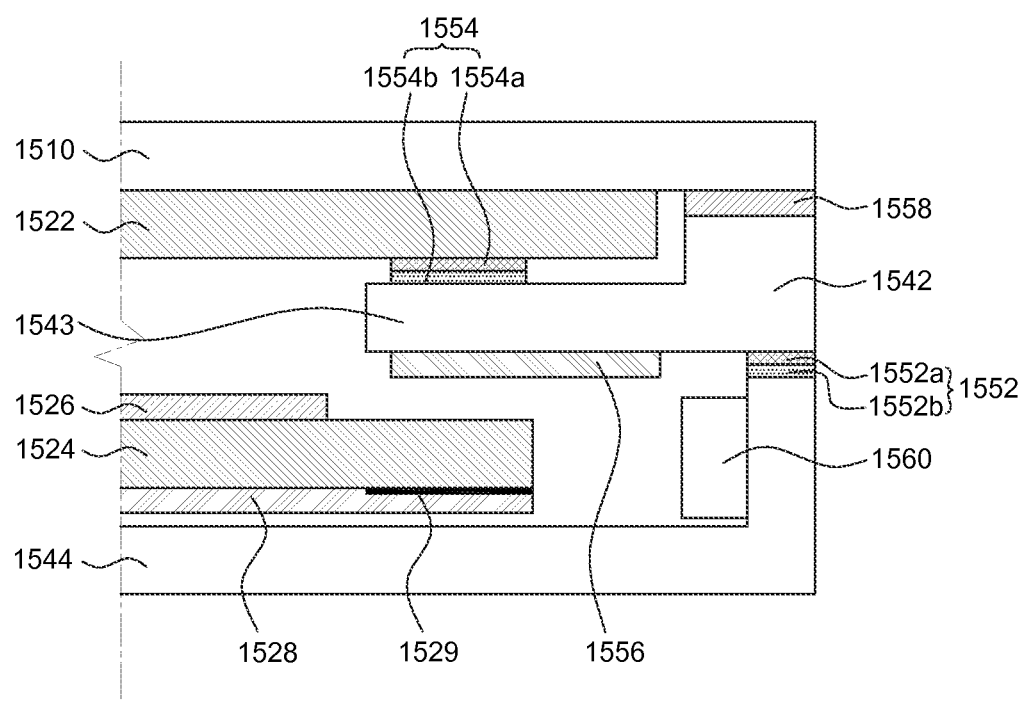
FIG. 15 is a schematic cross-sectional view of a liquid crystal display apparatus according to another exemplary embodiment of the present disclosure.

FIG. 15 is a schematic cross-sectional view of a liquid crystal display apparatus according to another exemplary embodiment of the present disclosure. For convenience in explanation, FIG. 15 illustrates that the transparent plate 910 is disposed on an upper side and the second chassis 944 is disposed on a lower side, as illustrated in FIG. 10.

A liquid crystal display apparatus 1500 illustrated in FIG. 15 is substantially the same as the liquid crystal display apparatus 900 illustrated in FIG. 10 except that a backlight unit 1560 is added and the second chassis 944 and the first chassis 942 are different in shape, and, thus, redundant explanation thereof will be omitted. If the liquid crystal display apparatus 900 includes the backlight unit 1560 at its lower end, FIG. 15 may be a cross-sectional view of the lower end of the liquid crystal display apparatus 900. The second chassis 944 includes a lateral wall perpendicular to the liquid crystal display panel 922 in order to accommodate the backlight unit 1560. The backlight unit 1560 is formed on the lateral wall. Since the second chassis 944 includes the lateral wall, the first chassis 942 may not include a downwardly protruding portion. However, since a separate cover unit for covering the second chassis 944 and the first chassis 942 is not formed, the first pad unit 952 formed of a black material is interposed between the second chassis 944 and the first chassis 942. Further, the second pad unit 945 is interposed between the protruding portion 943 of the first chassis 942 and the liquid crystal display panel 922.

Accordingly, in the liquid crystal display apparatus according to another exemplary embodiment of the present disclosure, as illustrated in FIG. 15, a distance between the components can be maintained by the first pad unit 952 regardless of whether the second chassis 944 includes the lateral wall or whether the backlight unit 1560 is present.

Figure 16:
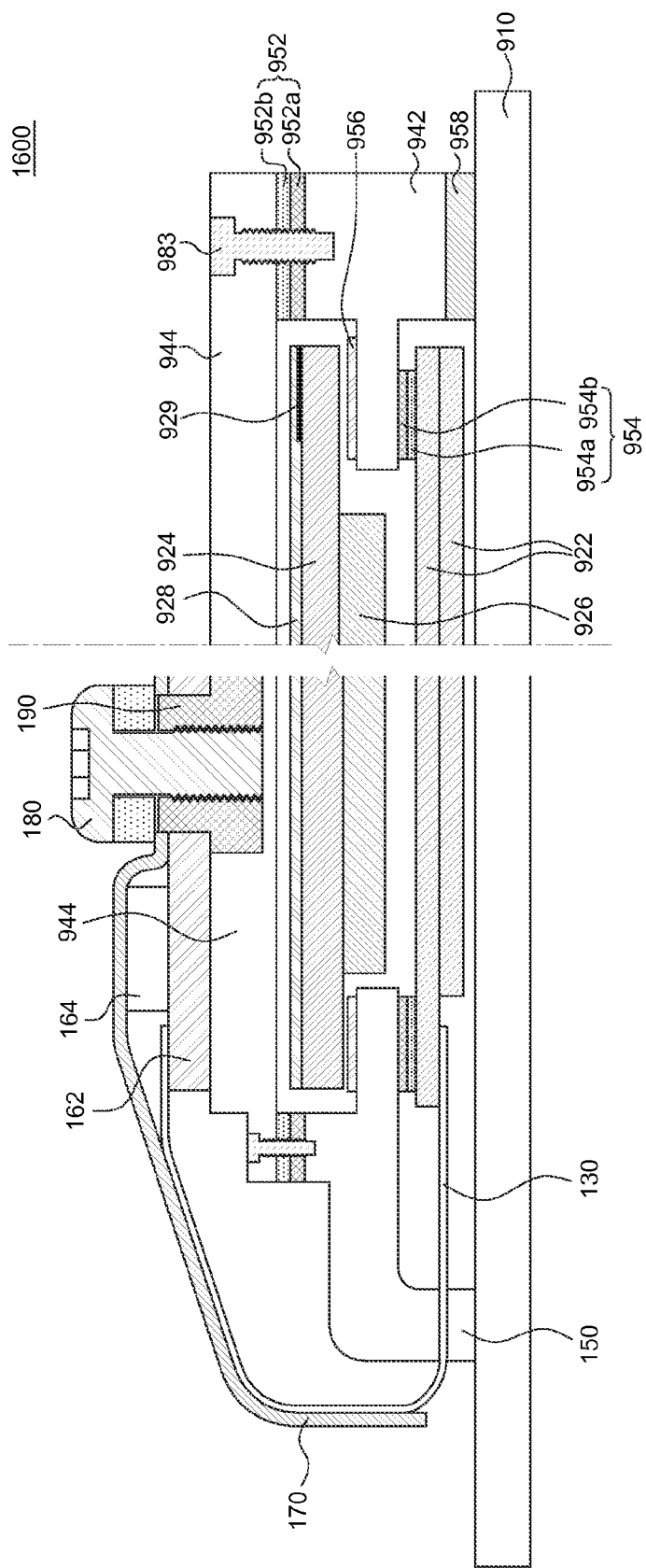
FIG. 16 is a schematic cross-sectional view of a liquid crystal display apparatus according to yet another exemplary embodiment of the present disclosure.

FIG. 16 is a schematic cross-sectional view of a liquid crystal display apparatus according to yet another exemplary embodiment of the present disclosure. A liquid crystal display apparatus 1600 illustrated in FIG. 16 includes the shield unit-fixing structure including the pem-nut 190 and the bolt 180 in the same manner as the liquid crystal display apparatus 100 illustrated in FIG. 2. It also includes the first pad unit 952 and the second pad unit 954 respectively including the foam pad layer 952a and 954a and the rigid layers 952b and 954b as illustrated in FIG. 10.

In FIG. 16, a portion where the shield unit-fixing structure including the pem-nut 190 and the bolt 180 is disposed corresponds to a cross-sectional view of a lateral side of the liquid crystal display apparatus 1600 where the flexible substrate 130 is disposed, and a portion where the shield unit-fixing structure is not disposed corresponds to a cross-sectional view of a lateral side where the flexible substrate 130 is not disposed. Any pad including a foam pad layer and a rigid layer may be disposed without limitation between the first chassis 942 and the second chassis 944 or between the first chassis 942 and the liquid crystal display panel 922 on the lateral side of the flexible substrate 130 where the shield unit-fixing structure is disposed.

A pressure and a force generated when the shield unit-fixing structure is formed by fastening the pem-nut 190 to the bolt 180 may change a distance between the second chassis 944 and the first chassis 942, between the light guide plate 924 and the first chassis 942, or between the first chassis 942 and the liquid crystal display panel 922. In particular, if the distance is reduced, the components are brought into contact with each other and may be damaged by each other. In the liquid crystal display apparatus 1600 according to another exemplary embodiment of the present disclosure, the shield unit 170 is fixed without a separation by the shield unit-fixing structure, so that a movement of the shield unit 170 can be minimized, and also, the pad unit 952, 954, and 956 are disposed between the components, so that a distance between the components can be maintained and damage can be reduced by suppressing a direct contact therebetween. Further, the pad units 952, 954, and 956 block a foreign material from the outside and reduce burr damage in the foam pad. Accordingly, it is possible to improve the reliability of the liquid crystal display apparatus 1600, and also possible to minimize a failure caused by a pushing between the components when the liquid crystal display apparatus 1600 is assembled. A pad structure such as the pad units 952, 954, and 956 reduces interference between the components within a body such as a chassis or the like, and also improves light leakage from a backlight.

According to an exemplary embodiment of the present disclosure, it is possible to provide a liquid crystal display apparatus in which a shield unit is fixed by fastening a pem-nut and a bolt. Also, a shied unit-fixing structure is provided to minimize pushing of the shield unit, so that after the shield unit is bolted, a change in a position of the shield unit caused by an external impact or vibration is minimized.

According to an exemplary embodiment of the present disclosure, it is possible to provide a thinner liquid crystal display apparatus in which a pem-nut having a top side higher than a top side of a circuit unit is included. Accordingly, a space where a shield unit can be moved is limited, thereby fixing the shield unit at a desired position, and, thus, a distance between the shield unit and other components can be secured.

Further, according to another exemplary embodiment of the present disclosure, a pad unit including a foam pad unit and a rigid layer minimizes a pressure generated when chassis and other components are overlapped in position, so that it is possible reduce a problem in visibility such as light leakage from a liquid crystal display apparatus and mura caused by non-uniformity due to a reflector.

According to another exemplary embodiment of the present disclosure, a pad unit including a foam pad unit and a rigid layer is used to maintain a narrow distance between components and also protect the components by absorbing an impact when the components are overlapped, so that the durability of a liquid crystal display apparatus can be improved.

It will be apparent to those skilled in the art that various modifications and variations can be made in the liquid crystal display apparatus of the present invention without departing from the spirit or scope of the invention. Thus, it is intended that the present invention cover the modifications and variations of this invention provided they come within the scope of the appended claims and their equivalents.

What is claimed is:

1. A liquid crystal display apparatus comprising:
a liquid crystal display panel;
a chassis unit configured to surround the liquid crystal display panel;
a circuit unit disposed to be in contact with the chassis unit;
a shield unit configured to surround at least a part of the chassis unit and circuit unit; and
a fixing structure configured to fix the shield unit and the circuit unit to the chassis unit,
wherein the fixing structure includes a pem-nut provided at the chassis unit and a bolt fastened to the pem-nut through a hole of the shield unit and a hole of the circuit unit, and has an edge joint structure in which a lateral side of the pem-nut is in contact with the hole of the shield unit.

2. The liquid crystal display apparatus according to claim 1, wherein the fixing structure further includes an annular ring disposed between the bolt and the pem-nut, and
the annular ring is in contact with a top side of the shield unit and a top side of the pem-nut.

3. A liquid crystal display apparatus comprising:
a liquid crystal display panel;
a first chassis outside the liquid crystal display panel;
a second chassis on the liquid crystal display panel to be parallel with the liquid crystal display panel and connected with the first chassis;
a circuit unit on the second chassis;
a flexible substrate of which one side is connected with the liquid crystal display panel and which is bent to surround the first chassis, so that the opposite side is connected with the circuit unit;
a shield unit disposed to surround at least a part of the flexible substrate and circuit unit and to be bonded to at least a part of the flexible substrate; and
a pem-nut including a bolt-insertion part and of which a top side is revealed through a hole penetrating the shield unit and the circuit unit,
wherein the top side of the pem-nut is positioned to be higher than a top side of the circuit unit.

4. The liquid crystal display apparatus according to claim 3, wherein the top side of the pem-nut is positioned to be on the same plane as a top side of the shield unit or higher than the top side of the shield unit.

5. The liquid crystal display apparatus according to claim 3, wherein the bolt-insertion part of the pem-nut is fastened to a bolt for fixing the shield unit.

6. The liquid crystal display apparatus according to claim 5, wherein an upper part of the pem-nut fills a space between the shield unit and the bolt.

7. The liquid crystal display apparatus according to claim 3, wherein the shield unit includes a portion in which an end portion of the hole is bent toward the second chassis, and the bent portion is in direct contact with the pem-nut.

8. The liquid crystal display apparatus according to claim 3, wherein the second chassis includes a fixture pin which is provided within the second chassis and configured to be inserted into a hole of the flexible substrate, the circuit unit, or the shield unit corresponding to the fixture pin to fix the shield unit.

9. The liquid crystal display apparatus according to claim 3, wherein the first chassis includes a first surface facing the second chassis and a second surface facing the liquid crystal display panel,
the liquid crystal display apparatus includes:
a first pad unit interposed between the second chassis and the first surface of the first chassis; and
a second pad unit interposed between the second surface of the first chassis and the liquid crystal display panel, and
at least one of the first pad unit and the second pad unit is composed of a foam pad layer and a rigid layer.

10. The liquid crystal display apparatus according to claim 9, wherein the second pad unit is bonded to the second surface of the first chassis, and
the second pad unit is in contact with the liquid crystal display panel to minimize a foreign material from the outside.

11. The liquid crystal display apparatus according to claim 9, further comprising:
a light guide plate inside the second chassis;
a reflector on one side of the light guide plate; and
an ink portion between an edge portion of the reflector and the light guide plate,
wherein the reflector and the second chassis are separated from each other by a distance equal to or smaller than thickness of the rigid layer.

12. The liquid crystal display apparatus according to claim 9, wherein the first chassis includes a protruding portion protruded toward a direction in which the liquid crystal display panel is disposed, and
the second surface is a surface of the protruding portion facing the liquid crystal display panel.

13. The liquid crystal display apparatus according to claim 12, further comprising:
a third pad unit on a third surface of the protruding portion facing a top side of the light guide plate,
wherein a distance between the third pad unit and the light guide plate is smaller than thickness of the first pad unit.

14. The liquid crystal display apparatus according to claim 13, wherein a sum of a distance between the reflector and the second chassis and a distance between the third pad unit and the light guide plate is smaller than the thickness of the first pad unit.

15. An electronic device comprising:
a body realized to accommodate a display panel;

a flexible circuit board realized such that one end is connected with the display panel and the opposite end is connected with a circuit unit;

a cover configured to cover the display panel and press a bottom side of the display panel and faces a bottom side of the circuit unit by folding the flexible circuit board along an edge of the display panel; and a fastening means configured to fix the cover to the body and suppress a positional deviation of the cover caused by an elastic restoring force of the flexible circuit board, wherein the fastening means includes a male screw and a female screw, wherein the female screw is provided at a fastening hole of the circuit unit.

16. The electronic device according to claim 15, wherein the male screw is realized to be introduced from the outside to pass through the fastening hole of the cover corresponding to the fastening hole of the circuit unit and to be accommodated by the female screw, and wherein, an outer peripheral surface of an inlet of the female screw is brought into contact with an inner peripheral surface of the fastening hole of the cover without having a space of deviation to suppress a positional deviation of the cover.

17. The electronic device according to claim 16, wherein the inner peripheral surface of the fastening hole of the cover is realized to have a burring structure.

18. The electronic device according to claim 16, further comprising:

a pad structure composed of a foam pad layer and a rigid layer to improve interference between components fastened by the fastening means and positioned within the body and improve light leakage from a backlight.

* * * * *